United States Patent
Lin et al.

(10) Patent No.: US 11,508,415 B2
(45) Date of Patent: Nov. 22, 2022

(54) SEMICONDUCTOR MEMORY PACKAGE STRUCTURE AND SEMICONDUCTOR MEMORY SYSTEM

(71) Applicant: Transcend Information, Inc., Taipei (TW)

(72) Inventors: Bing-Lian Lin, New Taipei (TW); Chao-Wei Ko, Taipei (TW)

(73) Assignee: Transcend Information, Inc., Taipei (TW)

( * ) Notice: Subject to any disclaimer, the term of this patent is extended or adjusted under 35 U.S.C. 154(b) by 25 days.

(21) Appl. No.: 17/200,911

(22) Filed: Mar. 15, 2021

(65) Prior Publication Data

US 2022/0293137 A1  Sep. 15, 2022

(51) Int. Cl.
*G11C 16/04* (2006.01)
*G11C 5/02* (2006.01)
*G11C 5/06* (2006.01)
*H01L 23/14* (2006.01)

(52) U.S. Cl.
CPC .............. *G11C 5/025* (2013.01); *G11C 5/063* (2013.01); *H01L 23/14* (2013.01); *H01L 2225/0651* (2013.01); *H01L 2225/06527* (2013.01); *H01L 2924/1434* (2013.01)

(58) Field of Classification Search
CPC ................................ G11C 5/025; G11C 5/063
See application file for complete search history.

(56) References Cited

U.S. PATENT DOCUMENTS

| | | | |
|---|---|---|---|
| 8,198,717 B1 | 6/2012 | Schenck | |
| 8,630,107 B2 | 1/2014 | Chu | |
| 8,901,750 B2 | 12/2014 | Park | |
| 10,014,038 B2* | 7/2018 | Morohashi | G11C 7/1087 |
| 10,796,981 B1* | 10/2020 | Chiang | H01L 23/3107 |
| 2016/0307873 A1* | 10/2016 | Chen | H01L 23/544 |

* cited by examiner

*Primary Examiner* — Pho M Luu
(74) *Attorney, Agent, or Firm* — Winston Hsu

(57) ABSTRACT

A semiconductor memory package structure includes at least one semiconductor die and a lead group. The at least one semiconductor die includes a chip enable terminal. The lead group is configured to electrically connect the chip enable terminal to an external circuit board and includes a first pin and a second pin coupled to the chip enable terminal. The at least one semiconductor die and the lead group are formed as an integral entity using an insulating material.

20 Claims, 15 Drawing Sheets

SEMICONDUCTOR MEMORY PACKAGE STRUCTURE AND SEMICONDUCTOR MEMORY SYSTEM

BACKGROUND

1. Technical Field

The present invention is related to a semiconductor memory package structure and a semiconductor memory system, and more particularly, to a semiconductor memory package structure and a semiconductor memory system capable of switching its chip enable configuration between one LUN per target and multiple LUNs per target.

2. Description of the Conventional Art

Semiconductor memory such as flash memory or random access memory is a solid state non-volatile memory characterized in low-power consumption, high resistance to vibration, and high resistance to physical impact when accidentally dropped. A semiconductor memory system such as solid state drive (SSD) or DRAM module is designed to provide reliable and high performance storage of user data across a flash-based memory system or a DRAM-based memory system containing a host interface controller (such as an SATA or PCIe interface) and a number of memory multi-chip packages (MCPs), where each MCP contains a stack of NAND semiconductor dice such as flash memory dice or DRAM dice and, optionally, a memory controller. For example, an SSD is based on the Open NAND Flash Interface (ONFI) protocol, and such NAND flash device includes an asynchronous data interface for high-performance I/O operations using a highly multiplexed 8-bit bus to transfer commands, address, and data. This hardware interface creates a low pin-count device with a standard pin layout that remains the same from one density to another, enabling future upgrades to higher densities with no board redesign.

A target is the unit of memory accessed by a chip enable signal. A target may contain one or more semiconductor dice. A semiconductor die is the minimum unit that can independently execute commands and report status, and is referred to as a logical unit (LUN) in the ONFI specification. There is at least one LUN per chip enable signal. In devices that have only one LUN per target, it is easy to identify abnormal semiconductor die. However, the limited amount of chip enable signals may not be sufficient in high density applications. In devices that have multiple LUNs per target, the performance can be improved by interleaving operations between the dice. However, it is difficult to identify the origin of failure since multiple dice share the same chip enable signal.

Therefore, there is a need of a semiconductor memory package structure and a semiconductor memory system capable of switching its chip enable configuration between one LUN per target and multiple LUNs per target.

SUMMARY

The present invention provides a semiconductor memory package structure which includes at least one semiconductor die and a lead group. The at least one semiconductor die includes a chip enable terminal configured to receive a chip enable signal for enabling the at least one semiconductor die. The lead group is configured to electrically connect the at least one semiconductor die to an external circuit board. A first pin and a second pin of the lead group are coupled to the chip enable terminal, and the at least one semiconductor die and the lead group are formed as an integral entity by using an insulating material.

The present invention also provides a semiconductor memory system which includes a printed circuit board, a controller provided on the printed circuit board, a semiconductor memory package structure and a mode selecting circuit. The semiconductor memory package includes a first semiconductor die having a first chip enable terminal, a second semiconductor die having a second chip enable terminal, and a lead group configured to electrically connect the first semiconductor die and the second semiconductor die to the printed circuit board. The lead group includes a first pin coupled to the first chip enable terminal, a second pin coupled to the first chip enable terminal and a third pin coupled to the second chip enable terminal, wherein the first semiconductor die, the second semiconductor die and the lead group are formed as an integral entity using an insulating material. The mode selecting circuit is provided on the printed circuit board and electrically connected between the lead group and the controller for adjusting a chip enable configuration of the semiconductor memory package structure.

The present invention also provides a semiconductor memory system which includes a printed circuit board, a controller provided on the printed circuit board, a semiconductor memory package structure and a mode selecting circuit. The semiconductor memory package structure includes a first semiconductor die having a first chip enable terminal, a second semiconductor die having a second chip enable terminal, and a lead group configured to electrically connect the first semiconductor die and the second semiconductor die to the printed circuit board. The lead group includes a first pin coupled to the first chip enable terminal, a second pin coupled to the first chip enable terminal, a third pin coupled to the second chip enable terminal, and a fourth pin coupled to the second chip enable terminal, wherein the first semiconductor die, the second semiconductor die and the lead group are formed as an integral entity using an insulating material. The mode selecting circuit is provided on the printed circuit board and configured to adjust a chip enable configuration of the semiconductor memory package structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
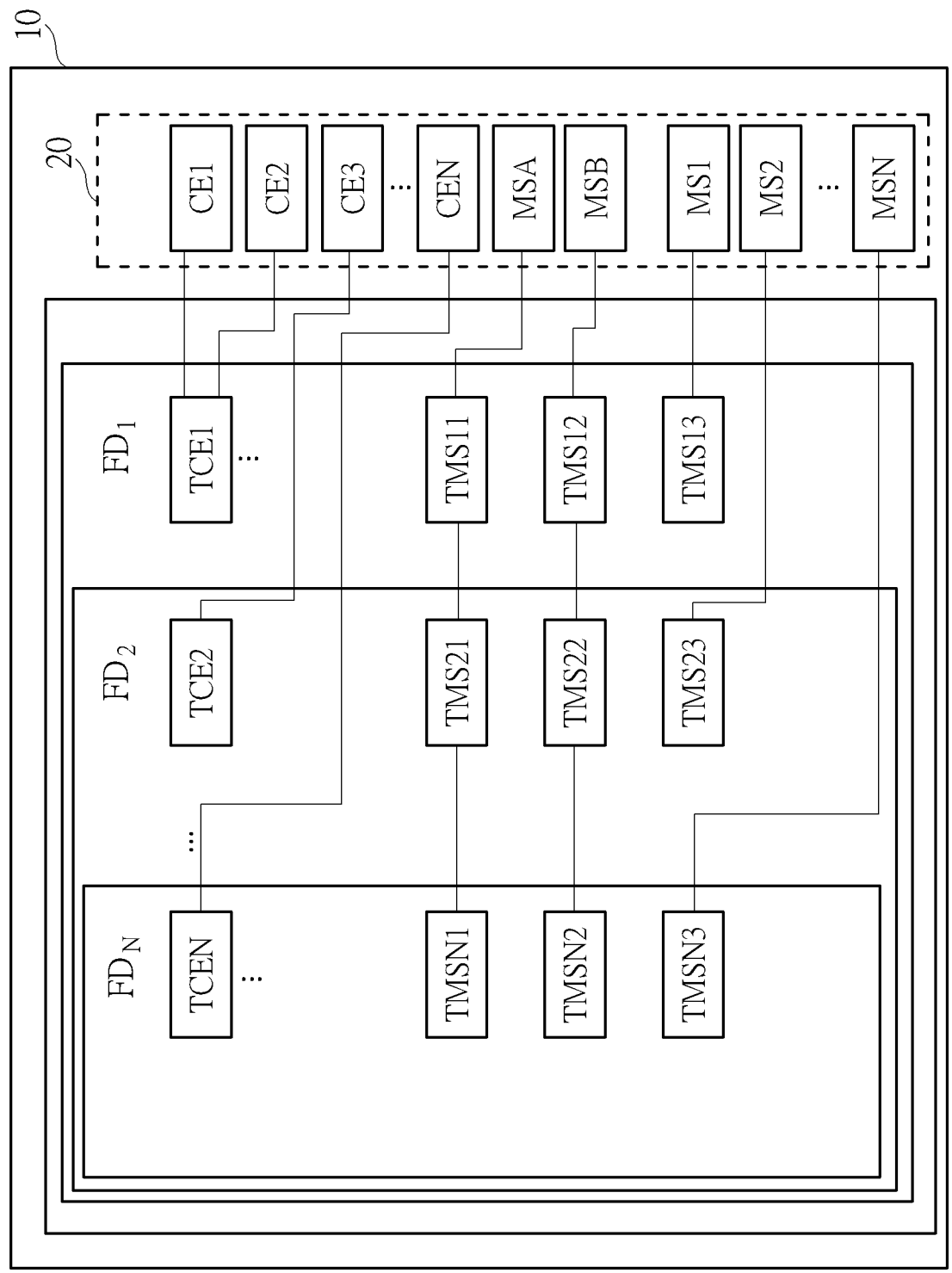
FIG. 1 is a functional diagram illustrating a semiconductor memory package structure according to an embodiment of the present invention.

FIG. 1 is a functional diagram illustrating a semiconductor memory package structure 10 according to an embodiment of the present invention. The semiconductor memory package structure 10 includes N semiconductor dice $FD_1$-$FD_N$ and a lead group 20, wherein N is a positive integer. Each of the N semiconductor dice $FD_1$-$FD_N$ includes a plurality of terminals and the lead group 20 includes a plurality of pins. Example terminals of the N semiconductor dice $FD_1$-$FD_N$ include chip enable terminals TCE1-TCEN and mode select terminals TMS11-TMS13, TMS21-TMS23 and TMSN1-TMSN3. The chip enable terminals TCE1-TCEN are used for receiving chip enable signal from a controller to enable the correspondent semiconductor dice $FD_1$-$FD_N$ individually (one LUN per target) or simultaneously (multiple LUNs per target). The mode select terminals TMS11-TMS13, TMS21-TMS23 and TMSN1-TMSN3 are used for receiving mode select signal from the controller to indicate chip enable configuration of the semiconductor memory package according to the chip enable configuration of the semiconductor dice $FD_1$-$FD_N$. In particular, the number, connection and the arrangement of the mode select terminals and the corresponding circuit in the mode selecting circuit of the present invention may be different according to the manufacturing process or design of the semiconductor die. The lead group 20 functions as an interface between the N semiconductor dice $FD_1$-$FD_N$ and an external circuit (not shown in FIG. 1).

Figure 2:
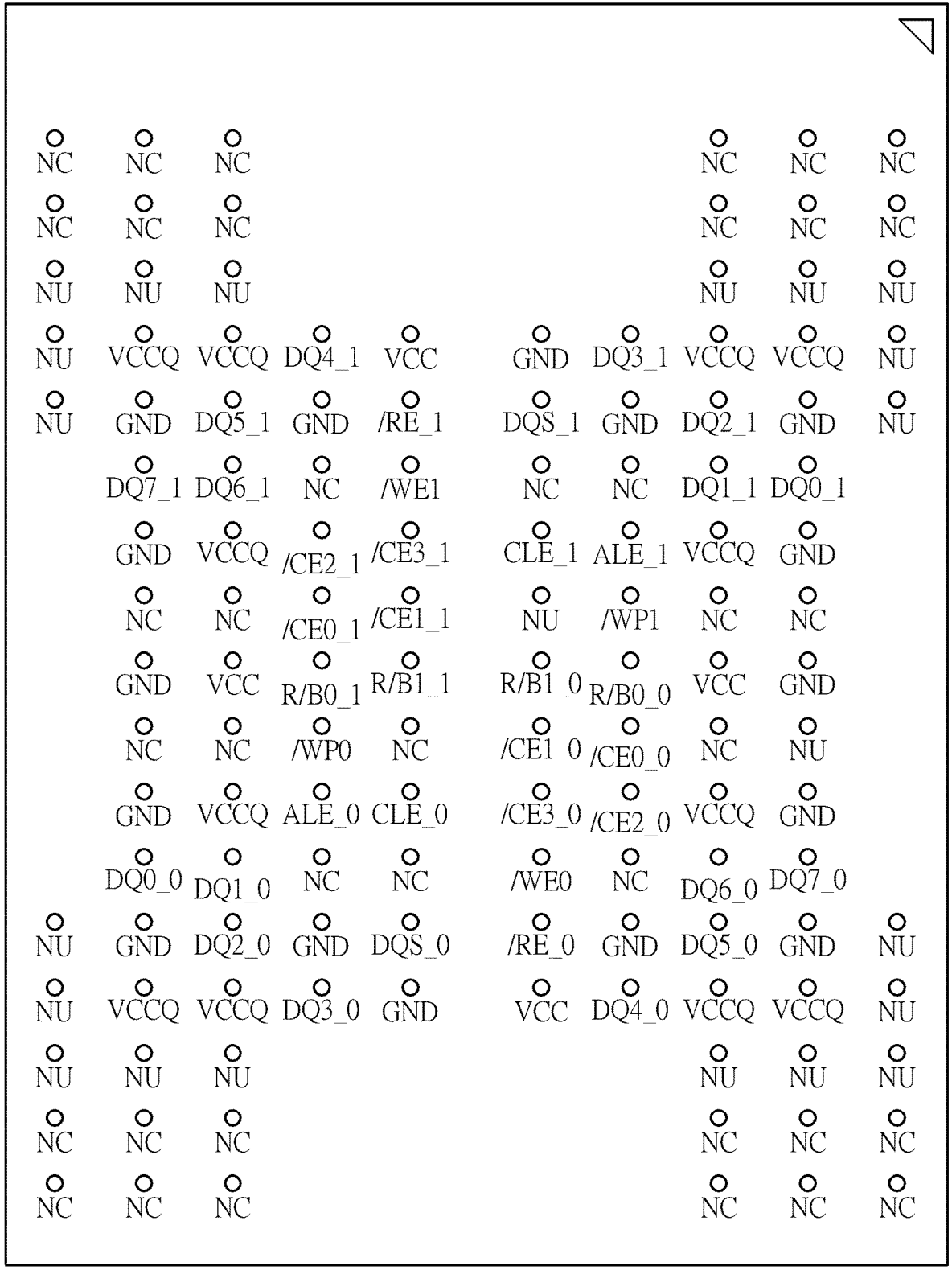
FIG. 2 is a diagram illustrating a bottom view of a semiconductor memory package structure according to an embodiment of the present invention.

In the semiconductor memory package structure 10, the N semiconductor dice $FD_1$-$FD_N$ and the lead group 20 is formed as an integral entity by using insulating material. FIG. 2 is a diagram illustrating a bottom view of the semiconductor memory package structure 10 which shows the pin arrangement of the lead group 20. Example pins of the lead group 20 include I/O pins DQ0_0~DQ7_0 and DQ0_1~DQ7_1, control pins (chip enable pins /CE1_0-/CE3_0 and /CE1_1-/CE3_1, address latch enable pins ALE_0 and ALE_1, command latch enable pins CLE_0 and CLE_1, read enable pins /RE_0 and/RE_1, write enable pins /WE0 and /WE1, write protect pins /WP0 and /WP1, ready/busy pins R/B0_0, R/B0_0, R/B1_0, R/B0_1), supply pins VCC, VCCQ and GND, do-not-use pins NU, and no connection pins NC. However, the pin arrangement of the lead group 20 does not limit the scope of the present invention.

In general, the chip enable terminal of each of the N semiconductor dice is coupled to one corresponding pin of the lead group. However, in the present invention, the chip enable terminal of at least one of the N semiconductor dice is coupled to two pins of the lead group for a chip enable configuration adjustment foundation. For example as depicted in FIG. 1, the chip enable terminal TCE1 of the semiconductor dice $FD_1$ is coupled to the pin CE1 and the pin CE2 of the lead group 20, and the chip enable terminals TCE2-TCEN of the N semiconductor dice $FD_2$-$FD_N$ are coupled to the pins CE3-CEN of the lead group 20, respectively. Wherein, the pins CE1-CEN can be /CE, NC or NU which are chosen from the pins depicted in FIG. 2. Wherein, the connections between TCE1-TCEN and CE1-CEN and the connections between TMS11-TMS13, TMS21-TMS23, TMSN1-TMSN3, MSA, MSAB and MS1-MSN are by the use of wire bonding or any present connection method. In another embodiment, the chip enable terminals of at least one of the N semiconductor dice may be coupled to three or more pins of the lead group 20.

Figure 3A:
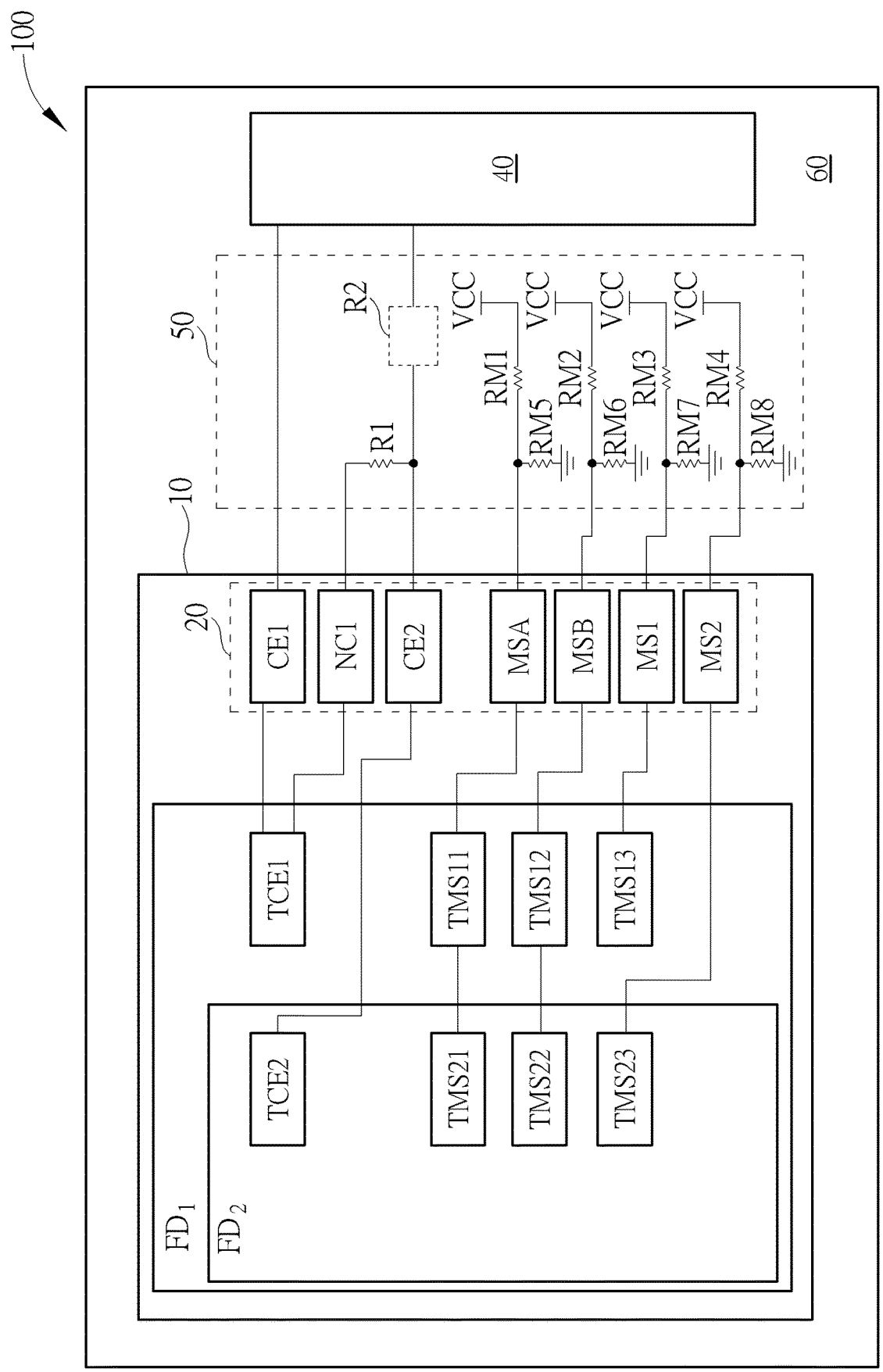
FIGS. 3A and 3B are diagrams illustrating a semiconductor memory system according to an embodiment of the present invention.
Figure 3B:
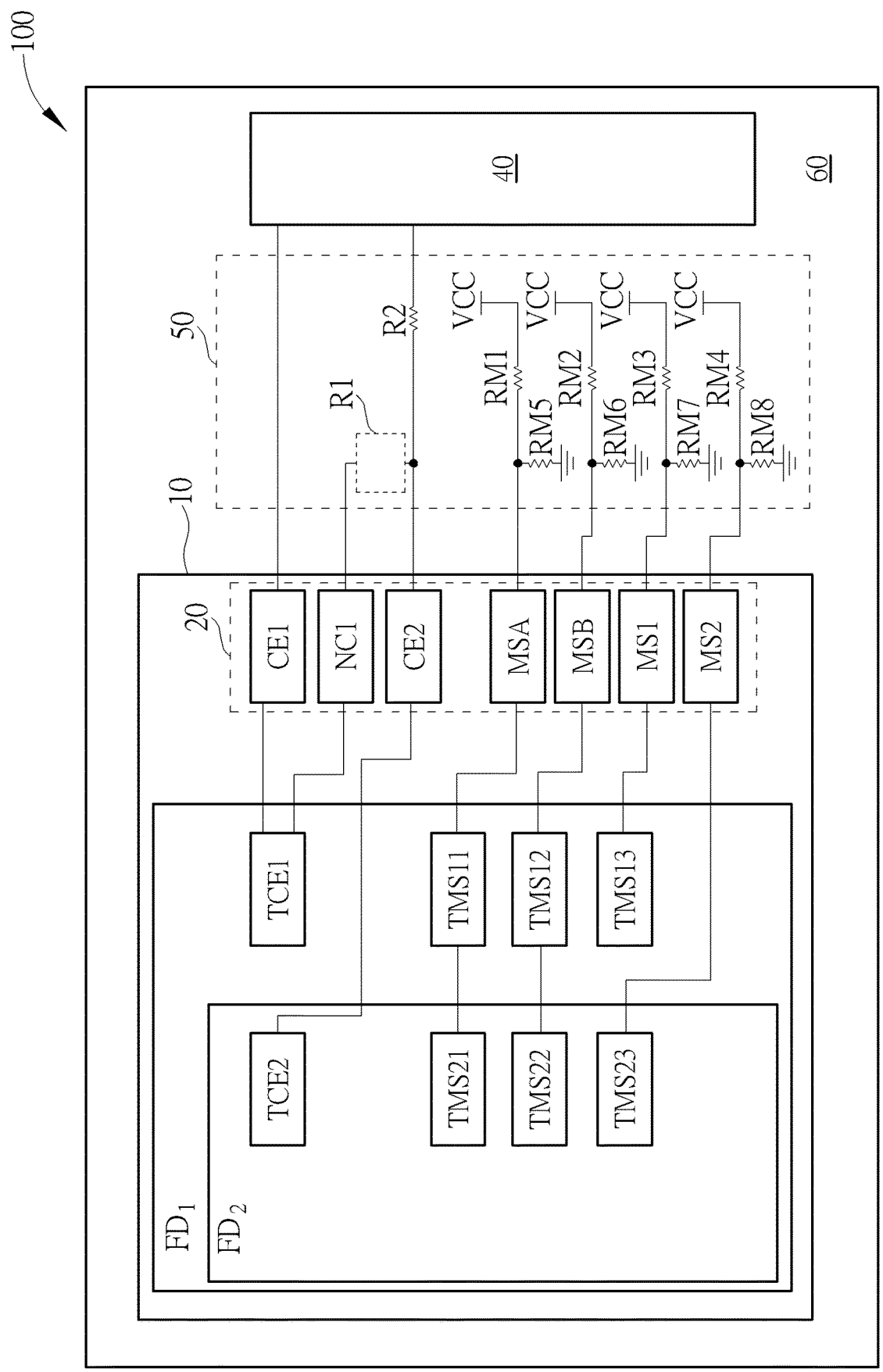

FIGS. 3A and 3B are diagrams illustrating a semiconductor memory system 100 according to an embodiment of the present invention. The semiconductor memory system 100 includes the semiconductor memory package structure 10 depicted in FIG. 1, a controller 40 and a mode selecting circuit 50 provided on a printed circuit board (PCB) 60. For illustrative purpose, FIGS. 3A and 3B depict the embodiment of N=2 in which the semiconductor memory package structure 10 includes two semiconductor dice $FD_1$ and $FD_2$ each having one chip enable terminal and three mode select terminals. However, the number of the semiconductor dice in the semiconductor memory package structure 10 does not limit the scope of the present invention.

In the semiconductor memory package structure 10 of the semiconductor memory system 100, the semiconductor die $FD_1$ includes a chip enable terminal TCE1 coupled to a chip enable pin CE1 and a no connection pin NC1 of the lead group 20, a mode select terminal TMS11 coupled to a mode select pin MSA of the lead group 20, a mode select terminal TMS12 coupled to a mode select pin MSB of the lead group 20, and a mode select terminal TMS13 coupled to a mode select pin MS1 of the lead group 20. The semiconductor die $FD_2$ includes a chip enable terminal TCE2 coupled to a chip enable pin CE2 of the lead group 20, a mode select terminal TMS21 coupled to the mode select pin MSA of the lead group 20, a mode select terminal TMS22 coupled to the mode select pin MSB of the lead group 20, and a mode select terminal TMS23 coupled to a mode select pin MS2 of the lead group 20.

The mode selecting circuit 50 of the semiconductor memory system 100 is configured to selectively couple the pin CE2 to the controller 40 or selectively couple the pin CE2 to the pin NC1, thereby adjusting the chip enable configuration of the semiconductor memory package structure 10. The mode selecting circuit 50 of the semiconductor memory system 100 includes a plurality of resistors, wherein the chip enable pin CE1 may be coupled to the controller 40 via the mode selecting circuit 50, a resistor R1 may be selectively provided between the chip enable pin CE2 and the no connection pin NC1, a resistor R2 may be selectively provided between the chip enable pin CE2 and the controller 40, a resistor RM1 may be selectively provided between the mode select pin MSA and a bias voltage VCC, a resistor RM2 may be selectively provided between the mode select pin MSB and a bias voltage VCC, a resistor RM3 may be selectively provided between the mode select pin MS1 and a bias voltage VCC, a resistor RM4 may be selectively provided between the mode select pin MS2 and a bias voltage VCC, a resistor RM5 may be selectively provided between the mode select pin MSA and a ground, a resistor RM6 may be selectively provided between the mode select pin MSB and a ground, a resistor RM7 may be selectively provided between the mode select pin MS1 and a ground, and a resistor RM8 may be selectively provided between the mode select pin MS2 and a ground. In another embodiment, the resistors R1 and R2 may be integrated into a variable resistor provided in the mode selecting circuit 50 for selectively switching between the position of R1 and the position of R2. The resistance of the variable resistor can be set to R1 or R2 according to its position. Similarly, the resistors RM1-RM8 may be integrated into another variable resistor for the similar function. In other words, the function of the variable resistors may be regarded as an open-circuited component or short-circuited component.

In the embodiment illustrated in FIG. 3A, the semiconductor memory package structure 10 of the semiconductor memory system 100 may operate in a multiple LUNs per target (two-die-one-CE) configuration by providing the resistor R1 in the mode selecting circuit 50 (or by switching the position of the variable resistor to the position of R1 and setting the resistance of the variable resistor to R1) and removing the resistor R2 from the mode selecting circuit 50 (the resistor R2 may be regarded as a path which is cut off when the resistors R1 and R2 are integrated into a variable resistor whose resistance is switched to R1). More specifically, the chip enable pin CE2 is electrically connected to the no connection pin NC1 via the resistor R1, while the direct path from the chip enable pin CE2 to the controller 40 is cut off. Under such circumstance, the chip enable terminal TCE1 of the semiconductor die $FD_1$ is coupled to the chip enable terminal TCE2 of the semiconductor die $FD_2$ via the chip enable pin CE2 and the no connection pin NC1. As a result, the semiconductor die $FD_1$ and the semiconductor die $FD_2$ share one chip enable signal sent from the controller 40 via the chip enable pin CE1. However, the chip enable signal can also be sent by a component or a circuit which is independent of the controller 40.

In the embodiment illustrated in FIG. 3B, the semiconductor memory package structure 10 of the semiconductor memory system 100 may operate in a one LUN per target (two-die-two-CE) configuration by providing the resistor R2 in the mode selecting circuit 50 (or by switching the position of the variable resistor to the position of R2 and setting the resistance of the variable resistor to R2) and removing the resistor R1 from the mode selecting circuit 50 (the resistor R1 may be regarded as a path which is cut off when the resistors R1 and R2 are integrated into a variable resistor whose resistance is switched to R2). More specifically, the chip enable pin CE2 is electrically connected to the controller 40 via the resistor R2, while the path between the chip enable pin CE2 to the no connection pin NC1 is cut off. Under such circumstance, the chip enable terminal TCE1 of the semiconductor die $FD_1$ is coupled to the controller 40 via the chip enable pin CE1, and the chip enable terminal TCE2 of the semiconductor die $FD_2$ is coupled to the controller 40 via the chip enable pin CE2. As a result, each of the semiconductor die $FD_1$ and the semiconductor die $FD_2$ has its own chip enable signal sent from the controller 40 via its corresponding chip enable pin.

In the semiconductor memory system 100, the mode select terminals TMS11-TMS13, TMS21-TMS23 of semiconductor dice $FD_1$-$FD_2$ need to be set for indicating the corresponding chip enable configuration of the semiconductor memory package structure 10. In other words, the setting of the mode select terminals TMS11-TMS13, TMS21-TMS23 depends on what the chip enable configuration is (i.e., one LUN per target configuration or multiple LUNs per target configuration). For example, in the embodiment illustrated in FIG. 3A, for indicating that the semiconductor memory package structure 10 has a multiple LUNs per target configuration, the resistors RM1, RM3, RM6 and RM8 may be provided in the mode selecting circuit 50, and the resistors RM2, RM4, RM5 and RM7 are removed from the mode selecting circuit 50. Thus, the mode select terminals TMS11, TMS13 and TMS21 may be coupled to the bias voltage VCC and the mode select terminals TMS12, TMS22 and TMS23 may be grounded. In another situation, as the embodiment illustrated in FIG. 3B, for indicating that the semiconductor memory package structure 10 is a one LUN per target configuration, the resistors RM1, RM3, RM6 and RM8 are removed from the mode selecting circuit 50, and the resistors RM2, RM4, RM5 and RM7 may be coupled to the mode selecting circuit 50. Thus, the mode select terminals TMS11, TMS13 and TMS21 may be grounded and the mode select terminals TMS12, TMS22 and TMS23 may be coupled to the bias voltage VCC. However, the setting of the mode select terminals TMS11-TMS13, TMS21-TMS23 or the arrangement of the resistors RM1-RM8 may be different according to the manufacturing process or design of the semiconductor dice $FD_1$ and $FD_2$.

Figure 4A:
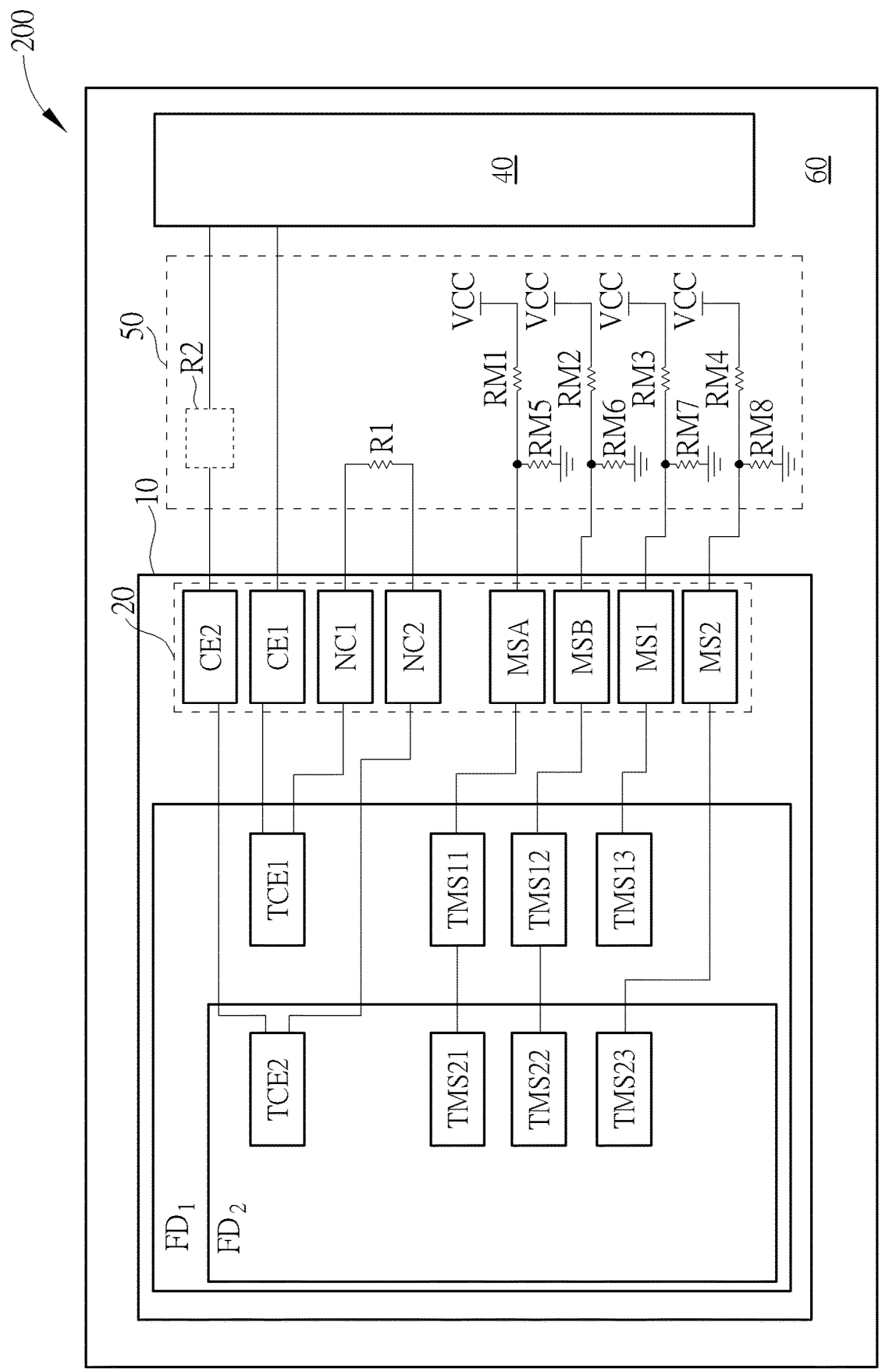
FIGS. 4A and 4B are diagrams illustrating a semiconductor memory system according to another embodiment of the present invention.
Figure 4B:
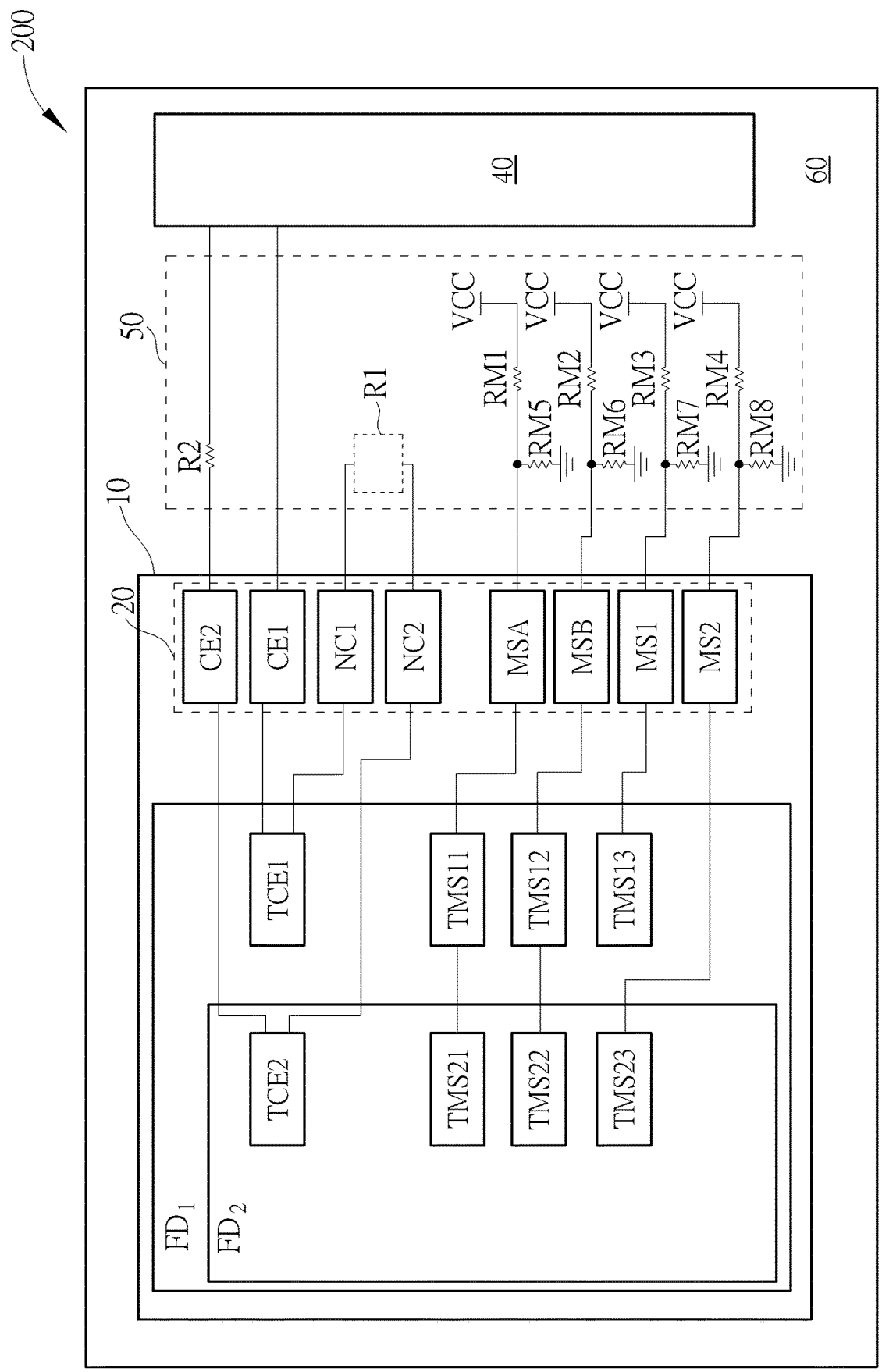

FIGS. 4A and 4B are diagrams illustrating a semiconductor memory system 200 according to an embodiment of the present invention. The semiconductor memory system 200 includes the semiconductor memory package structure 10 depicted in FIG. 1, a controller 40 and a mode selecting circuit 50 provided on a PCB 60. For illustrative purpose, FIGS. 4A and 4B depict the embodiment of N=2 in which the semiconductor memory package structure 10 includes two semiconductor dice $FD_1$-$FD_2$ each having a chip enable terminal and three mode select terminals. However, the number of the semiconductor dice in the semiconductor memory package structure 10 does not limit the scope of the present invention.

In the semiconductor memory package structure 10 of the semiconductor memory system 200, the semiconductor die $FD_1$ includes a chip enable terminal TCE1 coupled to a chip enable pin CE1 and a no connection pin NC1 of the lead group 20, a mode select terminal TMS11 coupled to a mode select pin MSA of the lead group 20, a mode select terminal TMS12 coupled to a mode select pin MSB of the lead group 20, and a mode select terminal TMS13 coupled to a mode select pin MS1 of the lead group 20. The semiconductor die $FD_2$ includes a chip enable terminal TCE2 coupled to a chip enable pin CE2 and a no connection pin NC2 of the lead group 20, a mode select terminal TMS21 coupled to the mode select pin MSA of the lead group 20, a mode select terminal TMS22 coupled to the mode select pin MSB of the lead group 20, and a mode select terminal TMS22 coupled to a mode select pin MS2 of the lead group 20.

The mode selecting circuit 50 of the semiconductor memory system 200 is configured to selectively couple the pin CE2 to the controller 40 or selectively couple the pin NC1 to the pin NC2, thereby adjusting the chip enable configuration of the semiconductor memory package structure 10. The mode selecting circuit 50 of the semiconductor memory system 200 includes a plurality of resistors, wherein the chip enable pin CE1 may be coupled to the controller 40 via the mode selecting circuit 50, a resistor R1 may be selectively provided between the no connection pins NC1 and NC2, a resistor R2 may be selectively provided between the chip enable pin CE2 and the controller 40, a resistor RM1 may be selectively provided between the mode select pin MSA and a bias voltage VCC, a resistor RM2 may be selectively provided between the mode select pin MSB and a bias voltage VCC, a resistor RM3 may be selectively provided between the mode select pin MS1 and the bias voltage VCC, and a resistor RM4 may be selectively provided between the mode select pin MS2 and a bias voltage VCC, a resistor RM5 may be selectively provided between the mode select pin MSA and a ground, a resistor RM6 may be selectively provided between the mode select pin MSB and a ground, a resistor RM7 may be selectively provided between the mode select pin MS1 and a ground, and a resistor RM8 may be selectively provided between the mode select pin MS2 and a ground. In another embodiment, the resistors R1 and R2 may be integrated into a variable resistor provided in the mode selecting circuit 50 for selectively switching between the position of R1 and the position of R2. The resistance of the variable resistor may be set to R1 or R2 according to its position. Similarly, the resistors RM1-RM8 may be integrated into another variable resistor for the similar function. In other words, the function of the variable resistors may be regarded as an open-circuited component or a short-circuited component.

In the embodiment illustrated in FIG. 4A, the semiconductor memory package structure 10 of the semiconductor memory system 200 may operate in a multiple LUNs per target configuration (two-die-one-CE) by providing the resistor R1 in the mode selecting circuit 50 (or by switching the variable resistor to the position of R1 and setting the resistance of the variable resistor to R1) and removing the resistor R2 from the mode selecting circuit 50 (the resistor R2 may be regarded as a path which is cut off when the resistors R1 and R2 are integrated into a variable resistor whose resistance is switched to R1). More specifically, the no connection pin NC1 is electrically connected to the no connection pin NC2 via the resistor R1, while the direct path from the chip enable pin CE2 to the controller 40 is cut off. Under such circumstance, the chip enable terminal TCE1 of the semiconductor die $FD_1$ is coupled to the chip enable terminal TCE2 of the semiconductor die $FD_2$ via the no connection pins NC1 and NC2. As a result, the semiconductor die $FD_1$ and the semiconductor die $FD_2$ share one chip enable signal sent from the controller 40 via the chip enable pin CE1.

In the embodiment illustrated in FIG. 4B, the semiconductor memory package structure 10 of the semiconductor memory system 200 may operate in a one LUN per target configuration (two-die-two-CE) by providing the resistor R2 in the mode selecting circuit 50 (or by switching the variable resistor to the position of R2 and setting the variable resistor to R2) and removing the resistor R1 from the mode selecting circuit 50 (the resistor R1 may be regarded as a path which is cut off when the resistors R1 and R2 are integrated into a variable resistor whose resistance is switched to R2). More specifically, the chip enable pin CE2 is electrically connected to the controller 40 via the resistor R2, while the path between the no connection pin NC1 and the no connection pin NC2 is cut off. Under such circumstance, the chip enable terminal TCE1 of the semiconductor die $FD_1$ is coupled to the controller 40 via the chip enable pin CE1, and the chip enable terminal TCE2 of the semiconductor die $FD_2$ is coupled to the controller 40 via the chip enable pin CE2. As a result, each of the semiconductor die $FD_1$ and $FD_2$ has its own chip enable signal sent from the controller 40 via its corresponding chip enable pin.

Regarding the setting of the mode select terminals TMS11-TMS13 and TMS21-TMS23, it has been described previously in FIGS. 3A and 3B, and will not be repeated here.

Figure 5:
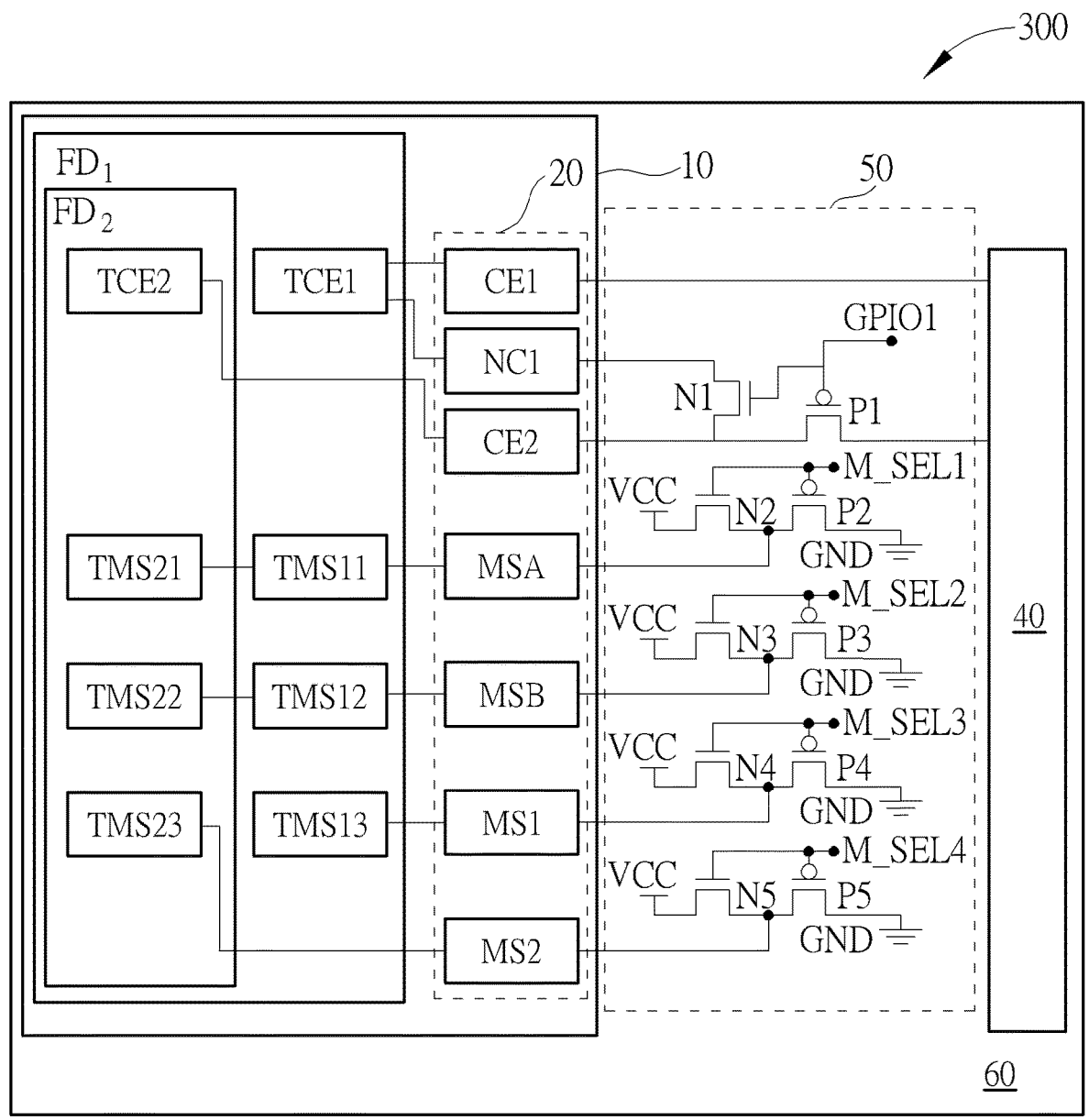
FIG. 5 is a diagram illustrating a semiconductor memory system according to another embodiment of the present invention.

FIG. 5 is a diagram illustrating a semiconductor memory system 300 according to an embodiment of the present invention. The semiconductor memory system 300 includes the semiconductor memory package structure 10 depicted in FIG. 1, a controller 40 and a mode selecting circuit 50 provided on a PCB 60. For illustrative purpose, FIG. 5 depicts the embodiment of N=2 in which the semiconductor memory package structure 10 includes two semiconductor dice $FD_1$ and $FD_2$ each having one chip enable terminal and three mode select terminals. However, the number of the semiconductor dice in the semiconductor memory package structure 10 does not limit the scope of the present invention.

In the semiconductor memory package structure 10 of the semiconductor memory system 300, the semiconductor die $FD_1$ includes a chip enable terminal TCE1 coupled to a chip enable pin CE1 and a no connection pin NC1 of the lead group 20, a mode select terminal TMS11 coupled to a mode select pin MSA of the lead group 20, a mode select terminal TMS12 coupled to a mode select pin MSB of the lead group 20, and a mode select terminal TMS13 coupled to a mode select pin MS1 of the lead group 20. The semiconductor die $FD_2$ includes a chip enable terminal TCE2 coupled to a chip enable pin CE2 of the lead group 20, a mode select terminal TMS21 coupled to the mode select pin MSA of the lead group 20, a mode select terminal TMS22 coupled to the mode select pin MSB of the lead group 20, and a mode select terminal TMS23 coupled to a mode select pin MS2 of the lead group 20.

In the semiconductor memory package structure 10 of the semiconductor memory system 300, the mode selecting circuit 50 is configured to selectively couple the pin CE2 to the controller 40 or selectively couple the pin CE2 to the pin NC1, thereby adjusting the chip enable configuration of the semiconductor memory package structure 10. The mode selecting circuit 50 of the semiconductor memory system. 300 may include a plurality of switches N1-N5 and P1-P5 provided in the mode selecting circuit 50. In the embodiment depicted in FIG. 5, the switch N1 includes a first end coupled to the no connection pin NC1 of the lead group 20, a second end coupled to the chip enable pin CE2 of the lead group 20, and a control end coupled to a die select signal GPIO1. The switch P1 includes a first end coupled to the chip enable pin CE2 of the lead group 20, a second end coupled to the controller 40, and a control end coupled to the die select signal GPIO1. The switch N2 includes a first end coupled to the mode select pin MSA of the lead group 20, a second end coupled to a bias voltage VCC, and a control end coupled to a mode select signal M_SEL1. The switch P2 includes a first end coupled to the mode select pin MSA of the lead group 20, a second end coupled to a ground GND, and a control end coupled to the mode select signal M_SEL1. The switch N3 includes a first end coupled to the mode select pin MSB of the lead group 20, a second end coupled to a bias voltage VCC, and a control end coupled to a mode select signal M_SEL2. The switch P3 includes a first end coupled to the mode select pin MSB of the lead group 20, a second end coupled to the ground GND, and a control end coupled to the mode select signal M_SEL2. The switch N4 includes a first end coupled to the mode select pin MS1 of the lead group 20, a second end coupled to the bias voltage VCC, and a control end coupled to a mode select signal M_SEL3. The switch P4 includes a first end coupled to the mode select pin MS1 of the lead group 20, a second end coupled to the ground GND, and a control end coupled to the mode select signal M_SEL3. The switch N5 includes a first end coupled to the mode select pin MS2 of the lead group 20, a second end coupled to the bias voltage VCC, and a control end coupled to a mode select signal M_SEL4. The switch P5 includes a first end coupled to the mode select pin MS2 of the lead group 20, a second end coupled to the ground GND, and a control end coupled to the mode select signal M_SEL4.

In the mode selecting circuit 50 of the semiconductor memory system 300, the switches N1 and P1 include an N-type device and a P-type device so that upon receiving the die select signal GPIO1, one of the switches N1 and P1 is turned on (short-circuited) while the other one is turned off (open-circuited). Each of the switches N2-N5, P2-P5 may be an N-type device or a P-type device. In the embodiment depicted in FIG. 5, the switches N1-N5 are N-type switches, and the switches P1-P5 are P-type switches. However, the type of the switches in the mode selecting circuit 50 of the semiconductor memory system 300 does not limit the scope of the present invention.

In the embodiment illustrated in FIG. 5, the semiconductor memory package structure 10 of the semiconductor memory system 300 may operate in a multiple LUNs per target (two-die-one-CE) configuration by setting the die select signal GPIO1 to logic "1", thereby turning on the switch N1 and turning off the switch P1. More specifically, the chip enable pin CE2 is electrically connected to the no connection pin NC1 via the turned-on switch N1, while the direct path from the chip enable pin CE2 to the controller 40 is cut off by the turned-off switch P1. Under such circumstance, the chip enable terminal TCE1 of the semiconductor die $FD_1$ is coupled to the chip enable terminal TCE2 of the semiconductor die $FD_2$ via the chip enable pin CE2 and the no connection pin NC1. As a result, the semiconductor die $FD_1$ and the semiconductor die $FD_2$ share one chip enable signal sent from the controller 40 via the chip enable pin CE1.

In the embodiment illustrated in FIG. 5, the semiconductor memory package structure 10 of the semiconductor memory system 300 may operate in a one LUN per target (two-die-two-CE) configuration by setting the die select signal GPIO1 to logic "0", thereby turning on the switch P1 and turning off the switch N1. More specifically, the chip enable pin CE2 is electrically connected to the controller 40 via turned-on switch P1, while the path between the chip enable pin CE2 and the no connection pin NC1 is cut off by the turned-off switch N1. Under such circumstance, the chip enable terminal TCE1 of the semiconductor die $FD_1$ is coupled to the controller 40 via the chip enable pin CE1, and the chip enable terminal TCE2 of the semiconductor die $FD_2$ is coupled to the controller 40 via the chip enable pin CE2. As a result, each of the semiconductor die $FD_1$ and the semiconductor die $FD_2$ has its own chip enable signal sent from the controller 40 via its corresponding chip enable pin.

In the semiconductor memory system 300, one or multiple mode select terminals TMS11-TMS13 and TMS21-TMS23 of each semiconductor die needs to be set for indicating the corresponding chip enable configuration of the semiconductor memory package structure 10. In other words, the setting of the mode select terminals TMS11-TMS13 and TMS21-TMS23 depends on what the chip enable configuration is (i.e., one LUN per target configuration or multiple LUNs per target configuration). For example, in the embodiment illustrated in FIG. 5, for indicating that the semiconductor memory package structure 10 is a multiple LUNs per target configuration, the mode select signals M_SEL1 and M_SEL3 may be set to logic "1" for turning on the switches N2 and N4 and for turning off the switches P2 and P4, and the mode select signals M_SEL2 and M_SEL4 may be set to logic "0" for turning off the switches N3 and N5 and for turning on the switches P3 and P5. Thus, the mode select terminals TMS11, TMS13 and TMS21 may be coupled to the bias voltage VCC and the mode select terminals TMS12, TMS22 and TMS23 may be grounded. In another situation, for indicating that the semiconductor memory package structure 10 is a one LUN per target configuration in the embodiment illustrated FIG. 5, the mode select signals M_SEL1 and M_SEL3 may be set to logic "0" for turning off the switches N2 and N4 and for turning on the switches P2 and P4, and the mode select signals M_SEL2 and M_SEL4 may be set to logic "1" for turning on the switches N3 and N5 and for turning off the switches P3 and P5. Thus, the mode select terminals TMS11, TMS13 and TMS21 may be ground and the mode select terminals TMS12, TMS22 and TMS23 may be coupled to the bias voltage VCC. However, the setting of the mode select terminals TMS11-TMS13 and TMS21-TMS23 or the setting of the mode select signals M_SEL1-M_SEL4 may be different according to the manufacturing process or design of the semiconductor dice $FD_1$ and $FD_2$, and the die select signal GPIO1 and the mode select signals M_SEL1-M_SEL4 may be set or sent from the controller 40, a similar function component(s) or circuit.

Figure 6A:
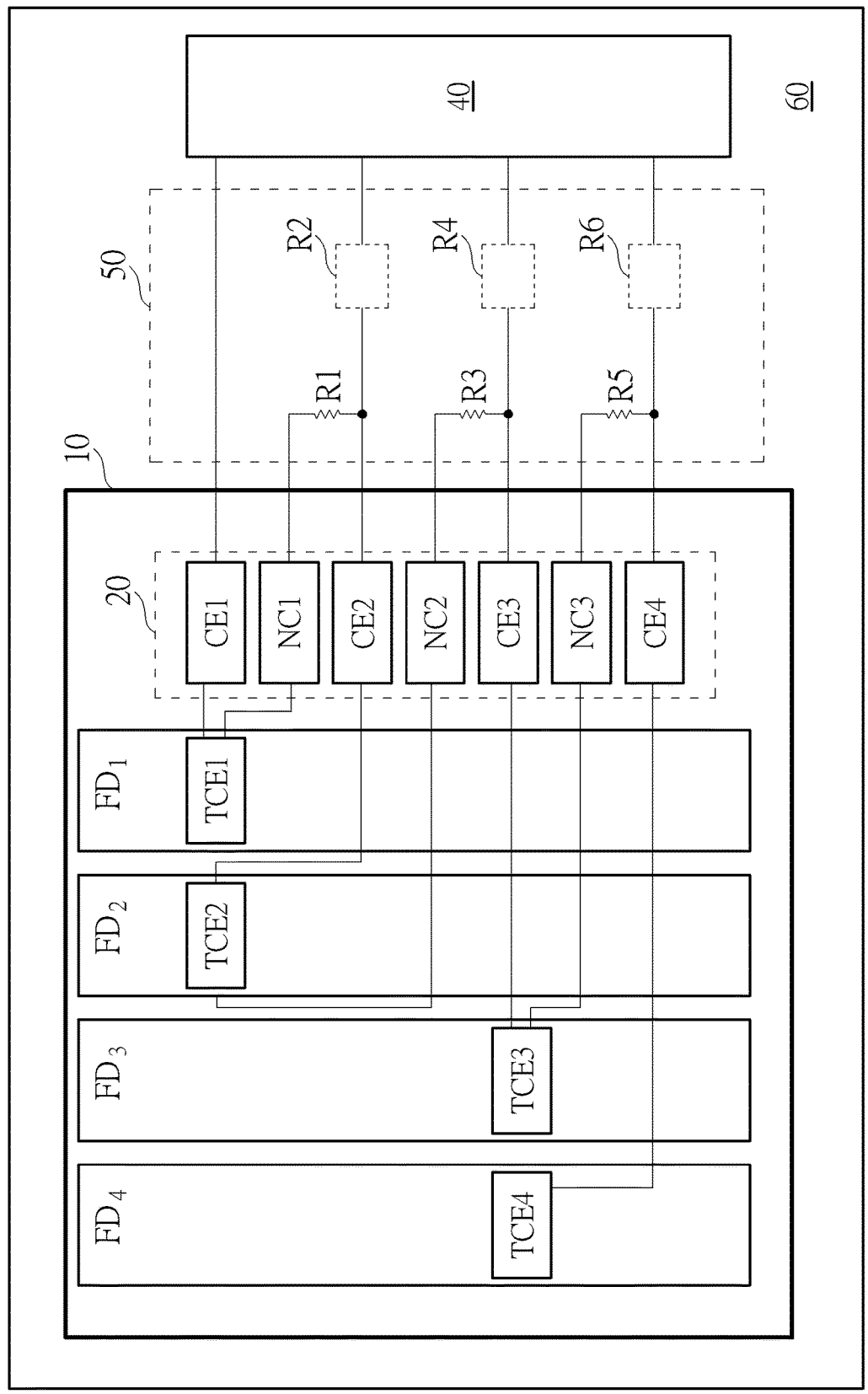
FIGS. 6A-6C are diagrams illustrating a semiconductor memory system according to another embodiment of the present invention.
Figure 6B:
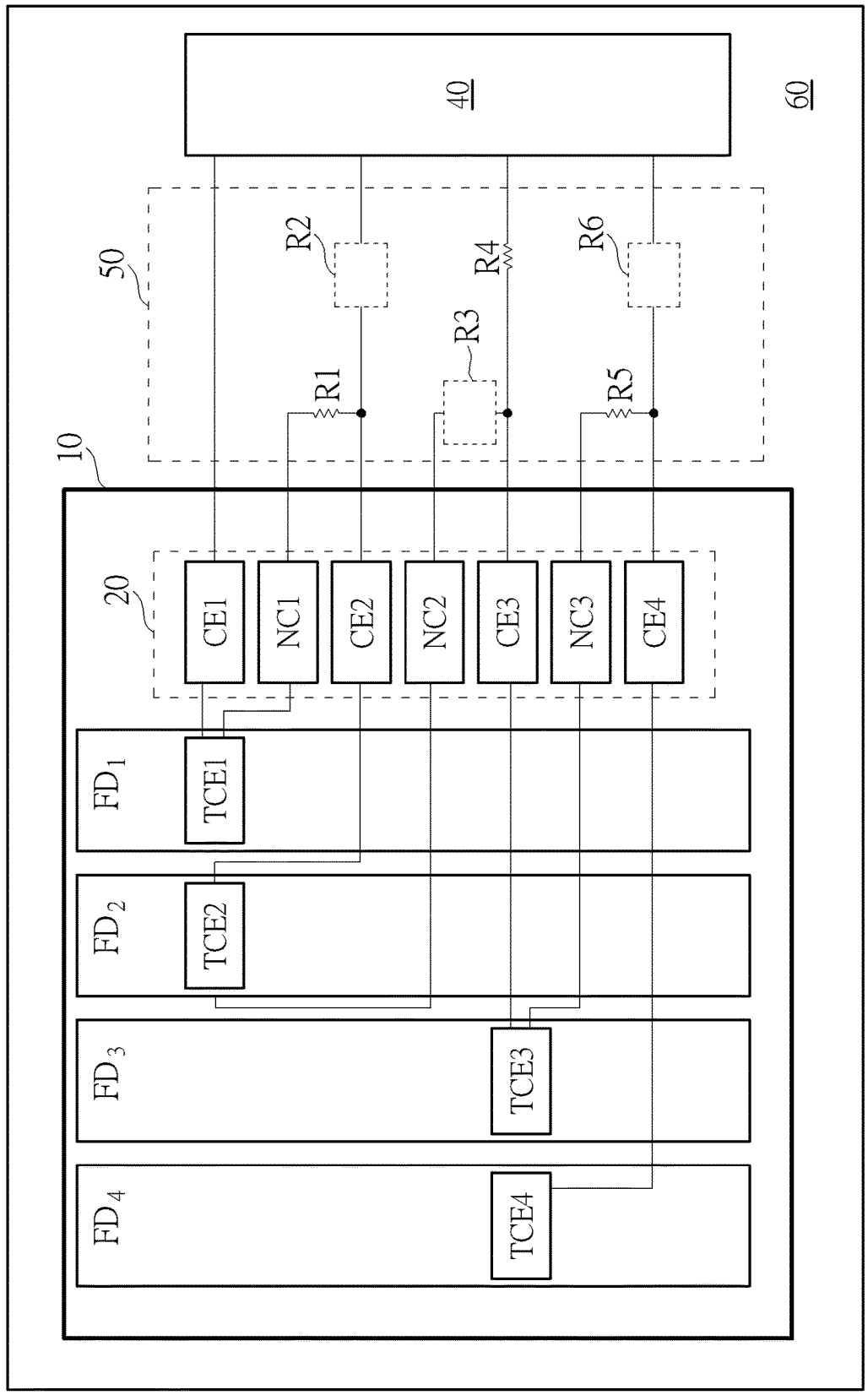
Figure 6C:
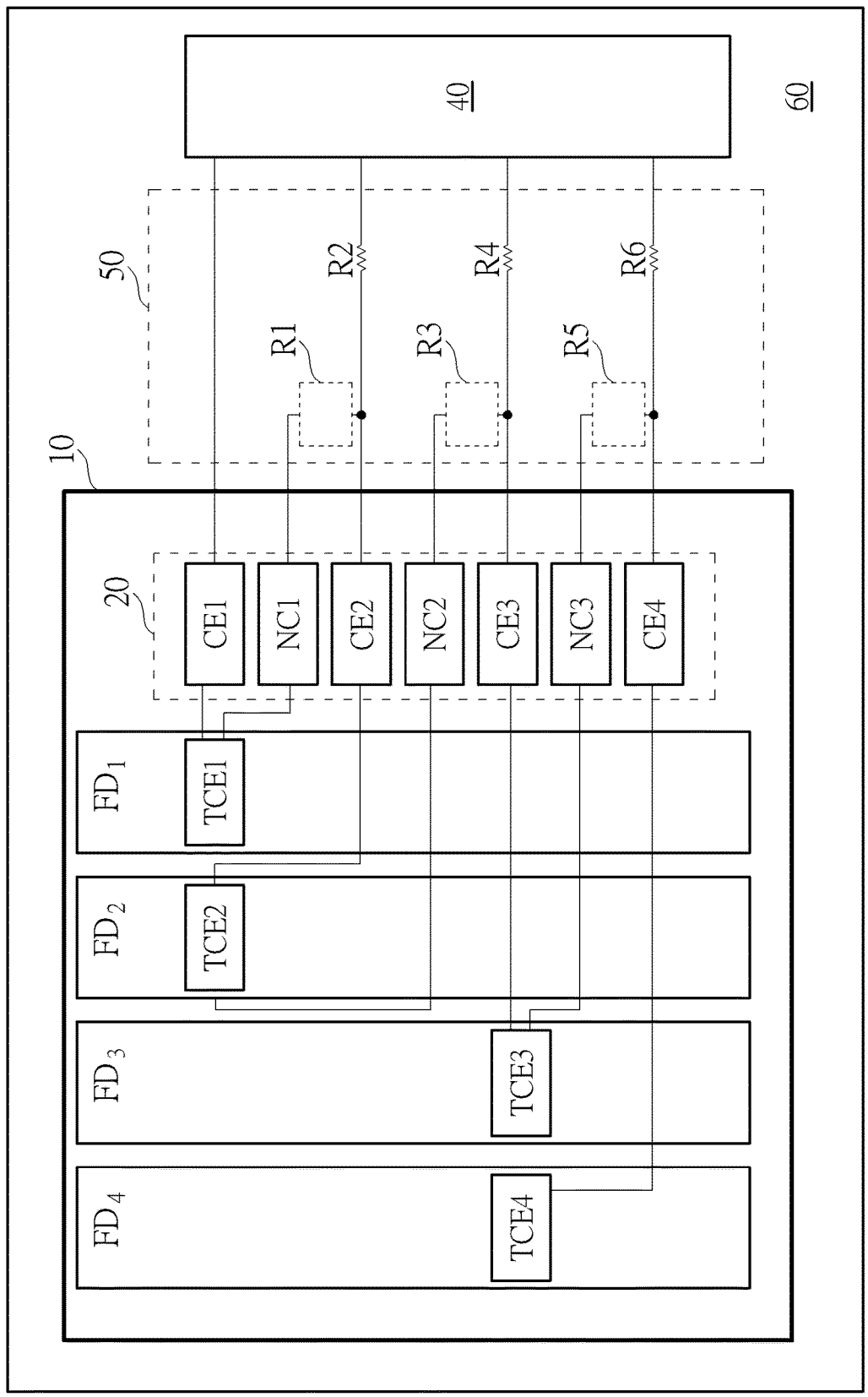

FIGS. 6A-6C are diagrams illustrating a semiconductor memory system 400 according to an embodiment of the present invention. The semiconductor memory system 400 includes the semiconductor memory package structure 10 depicted in FIG. 1, a controller 40 and a mode selecting circuit 50 provided on a PCB 60. For illustrative purpose, FIGS. 6A-6C depict the embodiment of N=4 in which the semiconductor memory package structure 10 includes four semiconductor dice $FD_1$-$FD_4$ and a lead group 20 formed as an integral entity by using insulating material. However, the number of the semiconductor dice in the semiconductor memory package structure 10 does not limit the scope of the present invention.

In the semiconductor memory package structure 10 of the semiconductor memory system 400, the semiconductor die $FD_1$ includes a chip enable terminal TCE1 coupled to a chip enable pin CE1 and a no connection pin NC1 of the lead group 20, the semiconductor die $FD_2$ includes a chip enable terminal TCE2 coupled to a chip enable pin CE2 and a no connection pin NC2 of the lead group 20, the semiconductor die $FD_3$ includes a chip enable terminal TCE3 coupled to a chip enable pin CE3 and a no connection pin NC3 of the lead group 20, and the semiconductor die $FD_4$ includes a chip enable terminal TCE4 coupled to a chip enable pin CE4 of the lead group 20. The mode selecting circuit 50 includes six resistors R1-R6 for setting the chip enable configuration of the semiconductor memory package structure 10, wherein the chip enable pin CE1 may be coupled to the controller 40 via the mode selecting circuit 50, the resistor R1 may be selectively provided between the chip enable pin CE2 and the no connection pin NC1, the resistor R2 may be selectively provided between the chip enable pin CE2 and the controller 40, the resistor R3 may be selectively provided between the chip enable pin CE3 and the no connection pin NC2, the resistor R4 may be selectively provided between the chip enable pin CE3 and the controller 40, the resistor R5 may be selectively provided between the chip enable pin CE4 and the no connection pin NC3, and the resistor R6 may be selectively provided between the chip enable pin CE4 and the controller 40. In another embodiment, the resistors R1-R6 may be integrated into a variable resistor, which the relevant functions may be referred to the embodiment illustrated in FIGS. 3A and 3B and the corresponding paragraphs, and will not be repeated here.

In the embodiment illustrated in FIG. 6A, the semiconductor memory package structure 400 may operate in a multiple LUNs per target configuration (four-die-one-CE) by providing the resistors R1, R3 and R5 in the mode selecting circuit 50 (or by switching the variable resistor to the position of the resistors R1, R3 and R5 and setting the resistance of the variable resistor to R1, R3 and R5 respectively) and removing the resistors R2, R4 and R6 from the mode selecting circuit 50 (the resistors R2, R4 and R6 may be regarded as a plurality of paths which are cut off when the resistors R1-R6 are integrated into a variable resistor which is switched to the position of the resistors R1, R3 and R5). More specifically, the chip enable pin CE2 is electrically connected to the no connection pin NC1 via the resistor R1, the chip enable pin CE3 is electrically connected to the no connection pin NC2 via the resistor R3, and the chip enable pin CE4 is electrically connected to the no connection pin NC3 via the resistor R5, while the direct paths from the chip enable pins CE2-CE4 to the controller 40 are cut off. Under such circumstance, the chip enable terminals TCE1-TCE4 of the semiconductor dice $FD_1$-$FD_4$ are coupled together. As a result, the semiconductor dice $FD_1$-$FD_4$ share one chip enable signal sent from the controller 40 via the chip enable pin CE1.

In the embodiment illustrated in FIG. 6B, the semiconductor memory package structure 400 may operate in a multiple LUNs per target configuration (four-die-two-CE) configuration by providing the resistors R1, R4 and R5 in the mode selecting circuit 50 (or by switching the variable resistor to the resistance of the resistors R1, R4 and R5 and setting the resistance of the variable resistor to R1, R4 and R5 respectively) and removing the resistors R2, R3 and R6 from the mode selecting circuit 50 (the resistors R2, R3 and R6 may be regarded as a plurality of paths which are cut off when the resistors R1-R6 are integrated into a variable resistor which is switched to the position of the resistors R1, R4 and R5). More specifically, the chip enable pin CE2 is electrically connected to the no connection pin NC1 via the resistor R1, the chip enable pin CE3 is electrically connected to the controller 40 via the resistor R4, and the chip enable pin CE4 is electrically connected to the no connection pin NC3 via the resistor R5, while the direct paths from the chip enable pin CE2 to the controller 40, from the chip enable pin CE4 to the controller 40 and from the chip enable pin CE3 to the no connection pin NC2 are cut off. Under such circumstance, the chip enable terminals TCE1 of the semiconductor die $FD_1$ is coupled to the chip enable terminal TCE2 of the semiconductor die $FD_2$ via the no connection pin NC1, and the chip enable terminal TCE3 of the semiconductor die $FD_3$ is electrically connected to the chip enable terminal TCE4 of the semiconductor die $FD_4$ via the no connection pin NC3. As a result, the semiconductor dice $FD_1$ and $FD_2$ share one chip enable signal sent from the controller 40 via the chip enable pin CE1, and the semiconductor dice $FD_3$ and $FD_4$ share one chip enable signal sent from the controller 40 via the chip enable pin CE3. On the other hand, the embodiment illustrated in FIG. 6B can be regarded as two groups, wherein the semiconductor dice $FD_1$ and $FD_2$ can be regarded as a first group and the semiconductor dice $FD_3$ and $FD_4$ can be regarded as a second group. Two groups have the same chip enable configuration, i.e., the multiple LUNs per target configuration (two-die-one-CE).

In the embodiment illustrated in FIG. 6C, the semiconductor memory package structure 20 may operate in a one LUN per target configuration (four-die-four-CE) by providing the resistors R2, R4 and R6 in the mode selecting circuit 50 (or by switching the variable resistor to the position of the resistors R2, R4 and R6 and setting the resistance of the variable resistor to R2, R4 and R6 respectively) and removing the resistors R1, R3 and R5 from the mode selecting circuit 50 (the resistors R1, R3 and R5 may be regarded as a plurality of paths which are cut off when the resistors R1-R6 are integrated into a variable resistor which is switched to the position of the resistors R2, R4 and R6). More specifically, the chip enable pin CE2 is electrically connected to the controller 40 via the resistor R2, the chip enable pin CE3 is electrically connected to the controller 40 via the resistor R4, and the chip enable pin CE4 is electrically connected to the controller 40 via the resistor R6, while the paths between the chip enable pin CE2 and the no connection pin NC1, between the chip enable pin CE3 and the no connection pin NC2, and between the chip enable pin CE4 and the no connection pin NC3 are cut off. Under such circumstance, the chip enable terminal TCE1 of the semiconductor die $FD_1$ is coupled to the controller 40 via the chip enable pin CE1, the chip enable terminal TCE2 of the semiconductor die $FD_2$ is coupled to the controller 40 via the chip enable pin CE2, the chip enable terminal TCE3 of the semiconductor die $FD_3$ is coupled to the controller 40 via the chip enable pin CE3, and the chip enable terminal TCE4 of the semiconductor die $FD_4$ is coupled to the controller 40 via the chip enable pin CE4. As a result, each of the semiconductor die $FD_1$-$FD_4$ has its own chip enable signal sent from the controller 40 via its corresponding chip enable pin.

Figure 7:
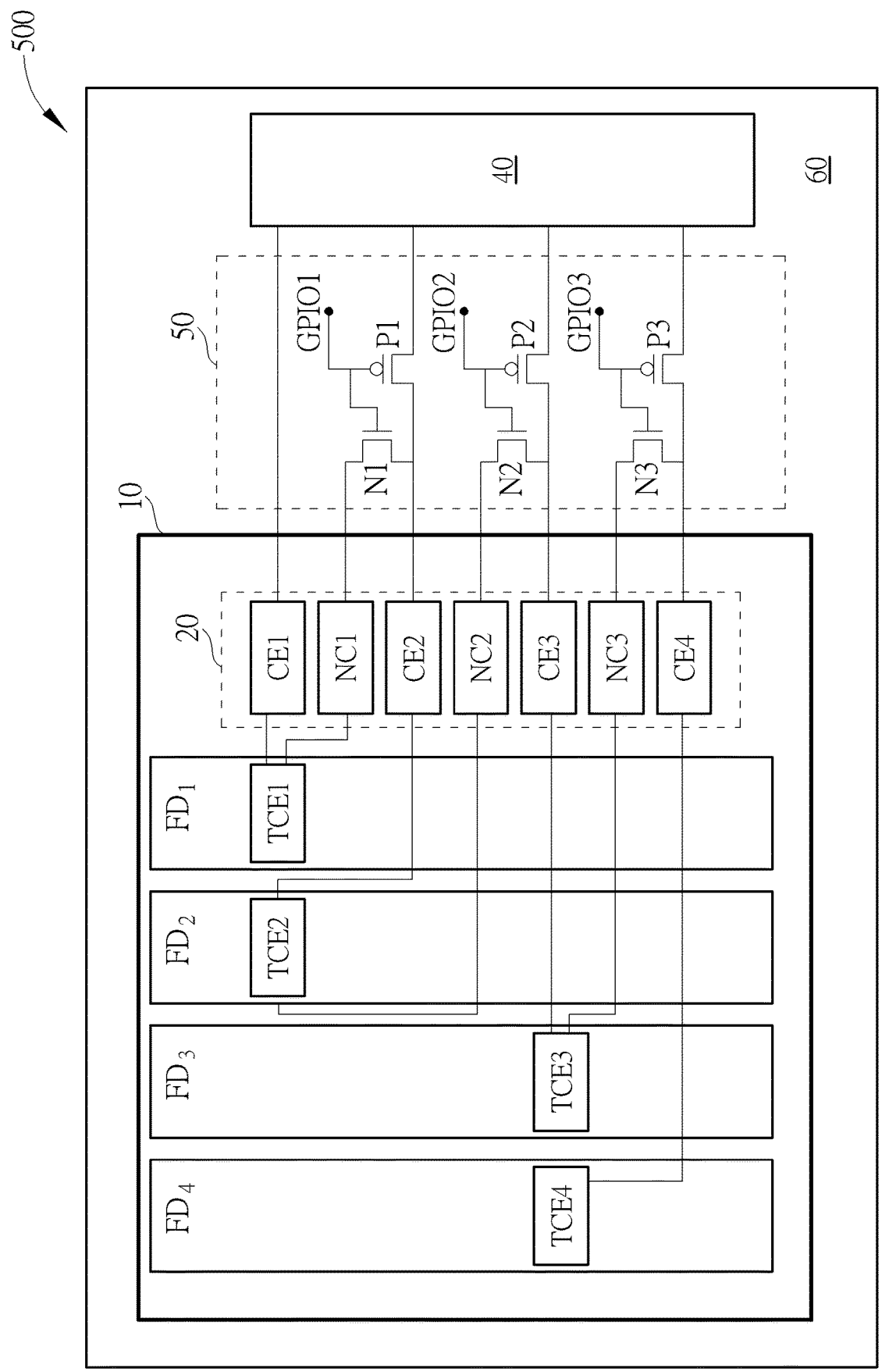
FIG. 7 is a diagram illustrating a semiconductor memory system according to another embodiment of the present invention.

FIG. 7 is a diagram illustrating a semiconductor memory system 500 according to an embodiment of the present invention. The semiconductor memory system 500 includes the semiconductor memory package structure 10 depicted in FIG. 1, a controller 40 and a mode selecting circuit 50 provided on a PCB 60. For illustrative purpose, FIG. 7 depicts the embodiment of N=4 in which the semiconductor memory package structure 10 includes four semiconductor dice $FD_1$-$FD_4$ and a lead group 20 formed as an integral entity by using insulating material. However, the number of the semiconductor dice in the semiconductor memory package structure 10 does not limit the scope of the present invention.

In the semiconductor memory package structure 10 of the semiconductor memory system 500, the semiconductor die $FD_1$ includes a chip enable terminal TCE1 coupled to a chip enable pin CE1 and a no connection pin NC1 of the lead group 20, the semiconductor die $FD_2$ includes a chip enable terminal TCE2 coupled to a chip enable pin CE2 and a no connection pin NC2 of the lead group 20, the semiconductor die $FD_3$ includes a chip enable terminal TCE3 coupled to a chip enable pin CE3 and a no connection pin NC3 of the lead group 20, and the semiconductor die $FD_4$ includes a chip enable terminal TCE4 coupled to a chip enable pin CE4 of the lead group 20.

In the semiconductor memory package structure 10 of the semiconductor memory system 500, the mode selecting circuit 50 is configured to selectively couple a pin of the lead group 20 to the controller 40 or selectively couple two pins of the lead group 20, thereby adjusting the chip enable configuration of the semiconductor memory package structure 10. The mode selecting circuit 50 of the semiconductor memory system 500 may include a plurality of switches N1-N3 and P1-P3 provided in the mode selecting circuit 50. In the embodiment depicted in FIG. 7, the switch N1 includes a first end coupled to the no connection pin NC1 of the lead group 20, a second end coupled to the chip enable pin CE2 of the lead group 20, and a control end coupled to a die select signal GPIO1. The switch P1 includes a first end coupled to the chip enable pin CE2 of the lead group 20, a second end coupled to the controller 40, and a control end coupled to the die select signal GPIO1. The switch N2 includes a first end coupled to the no connection pin NC2 of the lead group 20, a second end coupled to the chip enable pin CE3 of the lead group 20, and a control end coupled to a die select signal GPIO2. The switch P2 includes a first end coupled to the chip enable pin CE3 of the lead group 20, a second end coupled to the controller 40, and a control end coupled to the die select signal GPIO2. The switch N3 includes a first end coupled to the no connection pin NC3 of the lead group 20, a second end coupled to the chip enable pin CE4 of the lead group 20, and a control end coupled to a die select signal GPIO3. The switch P3 includes a first end coupled to the chip enable pin CE4 of the lead group 20, a second end coupled to the controller 40, and a control end coupled to the die select signal GPIO3.

In the mode selecting circuit 50 of the semiconductor memory system 500, each pair of the switches N1 and P1, the switches N2 and P2, and the switches N3 and P3 includes an N-type device and a P-type device so that upon receiving the corresponding die select signal, one switch in the pair is turned on (short-circuited) while the other one is turned off (open-circuited). In the embodiment depicted in FIG. 7, the switches N1-N3 are N-type switches, and the switches P1-P3 are P-type switches. However, the type of the switches in the mode selecting circuit 50 of the semiconductor memory system. 500 does not limit the scope of the present invention In the embodiment illustrated in FIG. 7, the semiconductor memory package structure 10 of the semiconductor memory system 500 may operate in a multiple LUNs per target (four-die-one-CE) configuration by setting the die select signals GPIO1-GPIO3 to logic "1", thereby turning on the switches N1-N3 and turning off the switches P1-P3. More specifically, the chip enable pin CE2 is electrically connected to the no connection pin NC1 via the turned-on switch N1, the chip enable pin CE3 is electrically connected to the no connection pin NC2 via the turned-on switch N2, and the chip enable pin CE4 is electrically connected to the no connection pin NC3 via the turned-on switch N3. Meanwhile, the direct paths from the chip enable pin CE2 to the controller 40, from the chip enable pin CE3 to the controller 40 and from the chip enable pin CE4 to the controller 40 are cut off by the turned-off switches P1-P3. Under such circumstance, the chip enable terminals TCE1-TCE4 of the semiconductor dice $FD_1$-$FD_4$ are coupled together via the no connection pins NC1-NC3. As a result, the semiconductor dice $FD_1$-$FD_4$ share one chip enable signal sent from the controller 40 via the chip enable pin CE1.

In the embodiment illustrated in FIG. 7, the semiconductor memory package structure 10 of the semiconductor memory system 300 may operate in a multiple LUNs per target configuration (four-die-two-CE) configuration by setting the die select signals GPIO1 and GPIO3 to logic "1" and setting the die select signal GPIO2 to logic "0", thereby turning on the switches N1, P2 and N3 while turning off the switches P1, N2 and P3. More specifically, the chip enable pin CE2 is electrically connected to the no connection pin NC1 via the turned-on switch N1, the chip enable pin CE3 is electrically connected to the controller 40 via the turned-on switch P2, and the chip enable pin CE4 is electrically connected to the no connection pin NC3 via the turned-on switch N3. Meanwhile, the path between the chip enable pin CE2 to the controller 40, between the chip enable pin CE3 to the no connection pin NC2, and between the chip enable pin CE4 to the controller 40 are cut off by the turned-off switches P1, N2 and P3. Under such circumstance, the chip enable terminal TCE1 of the semiconductor die $FD_1$ is coupled to the chip enable terminal TCE2 of the semiconductor die $FD_2$ via the no connection pin NC1, and the chip enable terminal TCE3 of the semiconductor die $FD_3$ is electrically connected to the chip enable terminal TCE4 of the semiconductor die $FD_4$ via the no connection pin NC3.

As a result, the semiconductor dice $FD_1$ and $FD_2$ share one chip enable signal sent from the controller 40 via the chip enable pin CE1, and the semiconductor dice $FD_3$ and $FD_4$ share another chip enable signal sent from the controller 40 via the chip enable pin CE3.

In the embodiment illustrated in FIG. 7, the semiconductor memory package structure 10 of the semiconductor memory system 300 may operate in a one LUN per target configuration (four-die-four-CE) configuration by setting the die select signals GPIO1-GPIO3 to logic "0", thereby turning on the switches P1-P3 and turning off the switches N1-N3. More specifically, the chip enable pins CE2-CE4 are electrically connected to the controller 40 via the turned-on switches P1-P3, respectively. Meanwhile, the path between the chip enable pin CE2 and the no connection pin NC1, between the chip enable pin CE3 and the no connection pin NC2, and between the chip enable pin CE4 and the no connection pin NC3 are cut off by the turned-off switches N1-N3, respectively. Under such circumstance, the chip enable terminal TCE1 of the semiconductor die $FD_1$ is coupled to the controller 40 via the chip enable pin CE1, the chip enable terminal TCE2 of the semiconductor die $FD_2$ is coupled to the controller 40 via the chip enable pin CE2, the chip enable terminal TCE3 of the semiconductor die $FD_3$ is coupled to the controller 40 via the chip enable pin CE3, and the chip enable terminal TCE4 of the semiconductor die $FD_4$ is coupled to the controller 40 via the chip enable pin CE4. As a result, each of the semiconductor die $FD_1$-$FD_4$ has its own chip enable signal sent from the controller 40 via its corresponding chip enable pin. However, the die select signal GPIO1-GPIO3 may be sent from the controller 40, a similar function component(s) or circuit.

Figure 8:
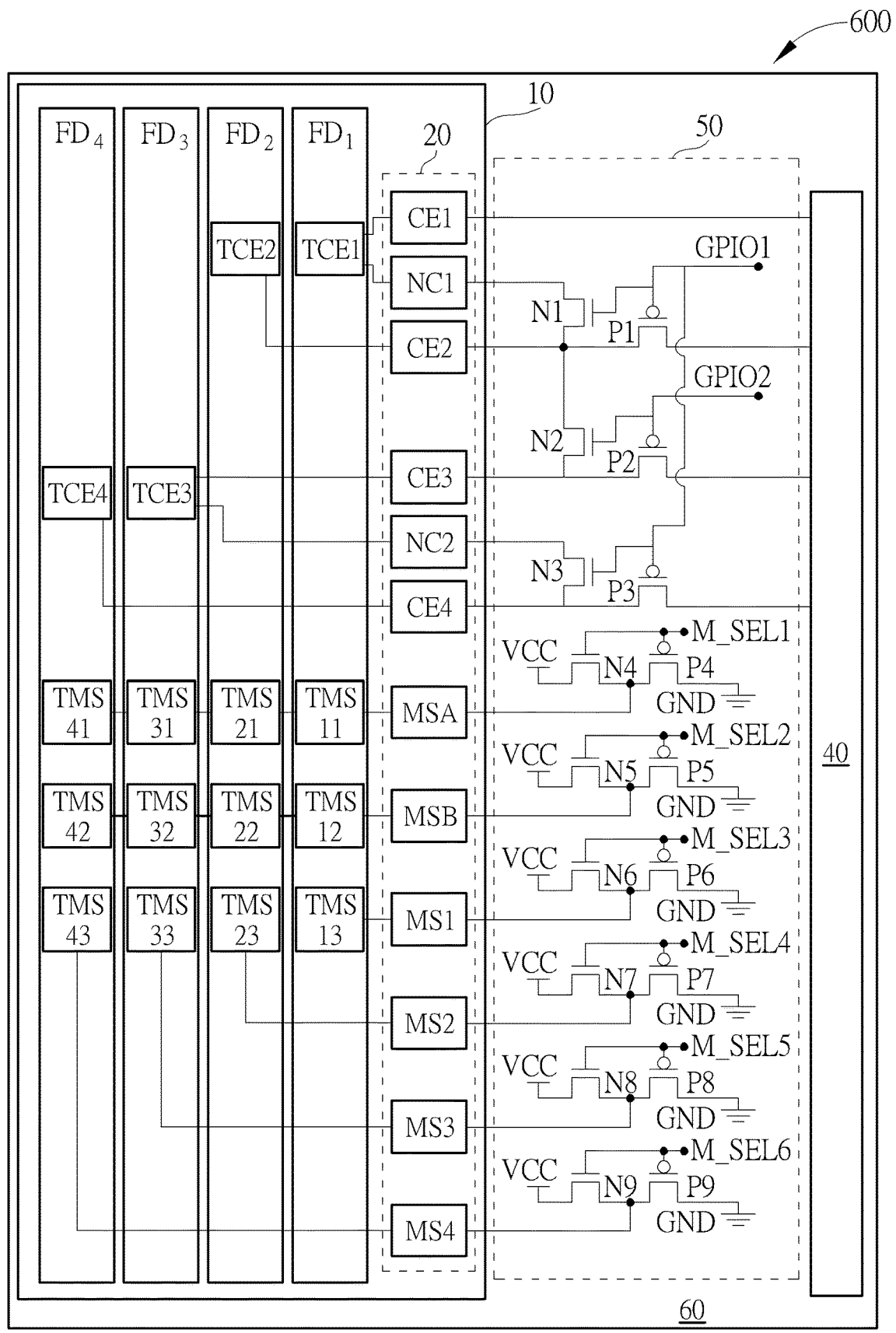
FIG. 8 is a diagram illustrating a semiconductor memory system according to another embodiment of the present invention.

FIG. 8 is a diagram illustrating a semiconductor memory system 600 according to an embodiment of the present invention. The semiconductor memory system 600 includes the semiconductor memory package structure 10 depicted in FIG. 1, a controller 40 and a mode selecting circuit 50 provided on a PCB 60. For illustrative purpose, FIG. 8 depicts the embodiment of N=4 in which the semiconductor memory package structure 10 includes four semiconductor dice $FD_1$-$FD_4$ each having a chip enable terminal and three mode select terminals and a lead group 20 formed as an integral entity by using insulating material. However, the number of the semiconductor dice in the semiconductor memory package structure 10 does not limit the scope of the present invention.

In the semiconductor memory package structure 10 of the semiconductor memory system 600, the semiconductor die $FD_1$ includes a chip enable terminal TCE1 coupled to a chip enable pin CE1 and a no connection pin NC1 of the lead group 20, a mode select terminal TMS11 coupled to a mode select pin MSA of the lead group 20, a mode select terminal TMS12 coupled to a mode select pin MSB of the lead group 20, and a mode select terminal TMS13 coupled to a mode select pin MS1 of the lead group 20. The semiconductor die $FD_2$ includes a chip enable terminal TCE2 coupled to a chip enable pin CE2, a mode select terminal TMS21 coupled to the mode select pin MSA of the lead group 20, a mode select terminal TMS22 coupled to the mode select pin MSB of the lead group 20, and a mode select terminal TMS23 coupled to a mode select pin MS2 of the lead group 20. The semiconductor die $FD_3$ includes a chip enable terminal TCE3 coupled to a chip enable pin CE3 and a no connection pin NC2 of the lead group 20, a mode select terminal TMS31 coupled to the mode select pin MSA of the lead group 20, a mode select terminal TMS32 coupled to the mode select pin MSB of the lead group 20, and a mode select terminal TMS33 coupled to a mode select pin MS3 pin of the lead group 20. The semiconductor die $FD_4$ includes a chip enable terminal TCE4 coupled to a chip enable pin CE4 of the lead group 20, a mode select terminal TMS41 coupled to the mode select pin MSA of the lead group 20, a mode select terminal TMS42 coupled to the mode select pin MSB of the lead group 20, and a mode select terminal TMS43 coupled to a mode select pin MS4 of the lead group 20.

In the semiconductor memory package structure 10 of the semiconductor memory system 600, the mode selecting circuit 50 is configured to selectively couple a pin of the lead group 20 to the controller 40 or selectively couple two pins of the lead group 20, thereby adjusting the chip select configuration of the semiconductor memory package structure 10. The mode selecting circuit 50 may include a plurality of switches N1-N9 and P1-P9 provided in the mode selecting circuit 50. In the embodiment depicted in FIG. 8, the switch N1 includes a first end coupled to the no connection pin NC1 of the lead group 20, a second end coupled to the chip enable pin CE2 of the lead group 20, and a control end coupled to a die select signal GPIO1. The switch N2 includes a first end coupled to the chip enable pin CE2 of the lead group 20, a second end coupled to the chip enable pin CE3 of the lead group 20, and a control end coupled to a die select signal GPIO2. The switch N3 includes a first end coupled to the no connection pin NC2 of the lead group 20, a second end coupled to the chip enable pin CE4 of the lead group 20, and a control end coupled to the die select signal GPIO1. The switch N4 includes a first end coupled to the mode select pin MSA of the lead group 20, a second end coupled to a bias voltage VCC, and a control end coupled to a mode select signal M_SEL1. The switch N5 includes a first end coupled to the mode select pin MSB of the lead group 20, a second end coupled to the bias voltage VCC, and a control end coupled to a mode select signal M_SEL2. The switch N6 includes a first end coupled to the mode select pin MS1 of the lead group 20, a second end coupled to the bias voltage VCC, and a control end coupled to a mode select signal M_SEL3. The switch N7 includes a first end coupled to the mode select pin MS2 of the lead group 20, a second end coupled to the bias voltage VCC, and a control end coupled to a mode select signal M_SEL4. The switch N8 includes a first end coupled to the mode select pin MS3 of the lead group 20, a second end coupled to the bias voltage VCC, and a control end coupled to a mode select signal M_SEL5. The switch N9 includes a first end coupled to the mode select pin MS4 of the lead group 20, a second end coupled to the bias voltage VCC, and a control end coupled to a mode select signal M_SEL6. The switch P1 includes a first end coupled to the chip enable pin CE2 of the lead group 20, a second end coupled to the controller 40, and a control end coupled to the die select signal GPIO1. The switch P2 includes a first end coupled to the chip enable pin CE3 of the lead group 20, a second end coupled to the controller 40, and a control end coupled to the die select signal GPIO2. The switch P3 includes a first end coupled to the chip enable pin CE4 of the lead group 20, a second end coupled to the controller 40, and a control end coupled to the die select signal GPIO1. The switch P4 includes a first end coupled to the mode select pin MSA of the lead group 20, a second end coupled to a ground GND, and a control end coupled to the mode select signal M_SEL1. The switch P5 includes a first end coupled to the mode select pin MSB of the lead group 20, a second end coupled to the ground GND, and a control end coupled to the mode select signal M_SEL2. The switch P6 includes a first end coupled to the mode select pin MS1 of the lead group 20, a second end coupled to the ground GND, and a control end coupled to the mode select signal M_SEL3. The switch P7 includes a first end coupled to the mode select pin MS2 of the lead group 20, a second end coupled to the ground GND, and a control end coupled to the mode select signal M_SEL4. The switch P8 includes a first end coupled to the mode select pin MS3 of the lead group 20, a second end coupled to the ground GND, and a control end coupled to the mode select signal M_SEL5. The switch P9 includes a first end coupled to the mode select pin MS4 of the lead group 20, a second end coupled to the ground GND, and a control end coupled to the mode select signal M_SEL6

In the mode selecting circuit 50 of the semiconductor memory system 600, each pair of the switches N1 and P1, the switches N2 and P2, and the switches N3 and P3 includes an N-type device and a P-type device so that upon receiving the die select signal GPIO1 or GPIO2, one switch in the pair is turned on (short-circuited) while the other one is turned off (open-circuited). Each of the switches N4-N9 and P4-P9 may be an N-type device or a P-type device. In the embodiment depicted in FIG. 8, the switches N1-N9 are N-type switches, and the switches P1-P9 are P-type switches. However, the type of the switches in the mode selecting circuit 50 of the semiconductor memory system 600 does not limit the scope of the present invention.

In the embodiment illustrated in FIG. 8, the semiconductor memory package structure 10 of the semiconductor memory system 600 may operate in a multiple LUNs per target configuration (four-die-one-CE) by setting the die select signals GPIO1 and GPIO2 to logic "1", thereby turning on the switches N1-N3 and turning off the switches P1-P3. More specifically, the chip enable pins CE2-CE4 and the no connection pins NC1-NC2 are electrically connected via the switches N1-N3, while the direct paths from the chip enable pins CE2-CE4 to the controller 40 are cut off by the switches P1-P3, respectively. Under such circumstance, the chip enable terminal TCE1 of the semiconductor die $FD_1$ is coupled to the chip enable terminals TCE2-TCE4 of the semiconductor die $FD_2$-$FD_4$. As a result, the semiconductor dice $FD_1$-$FD_4$ share one chip enable signal sent from the controller 40 via the chip enable pin CE1.

In the embodiment illustrated in FIG. 8, the semiconductor memory package structure 10 of the semiconductor memory system 600 may operate in a multiple LUNs per target configuration (four-die-two-CE) by setting the die select signal GPIO1 to logic "1" and setting the die select signals GPIO2 to logic "0", thereby turning on the switches N1, P2 and N3 and turning off the switches P1, N2 and P3. More specifically, the chip enable pin CE2 is electrically connected to the no connection pin NC1 via the switch N1, the chip enable pin CE3 is electrically connected to the controller 40 via the switch P2, the chip enable pin CE4 is electrically connected to the no connection pin NC2 via the switch N1, while the direct path from the chip enable pins CE2 and CE4 to the controller 40 and the direct path between the chip enable pins CE2 and CE3 are cut off. Under such circumstance, the chip enable terminal TCE1 of the semiconductor die $FD_1$ is coupled to the chip enable terminal TCE2 of the semiconductor die $FD_2$, and the chip enable terminal TCE3 of the semiconductor die $FD_3$ is coupled to the chip enable terminal TCE4 of the semiconductor die $FD_4$. As a result, the semiconductor dice $FD_1$ and $FD_2$ share one chip enable signal sent from the controller 40 via the chip enable pin CE1, and the semiconductor dice $FD_3$ and $FD_4$ share another chip enable signal sent from the controller 40 via the chip enable pin CE3.

In the embodiment illustrated in FIG. 8, the semiconductor memory package structure 10 of the semiconductor memory system 600 may operate in a multiple LUNs per target configuration (four-die-four-CE) by setting the die select signals GPIO1 and GPIO2 to logic "0", thereby turning on the switches P1-P3 and turning off the switches N1-N3. More specifically, the chip enable pins CE2-CE4 are electrically connected to the controller 40 via the switches P1-P3, while the paths between the chip enable pin CE2 and the no connection pin NC1, between the chip enable pins CE2 and CE3, and between the chip enable pin CE4 and the no connection pin NC2 are cut off. Under such circumstance, the chip enable terminal TCE1 of the semiconductor die $FD_1$ is coupled to the controller 40 via the chip enable pin CE1, the chip enable terminal TCE2 of the semiconductor die $FD_2$ is coupled to the controller 40 via the chip enable pin CE2, the chip enable terminal TCE3 of the semiconductor die $FD_3$ is coupled to the controller 40 via the chip enable pin CE3, and the chip enable terminal TCE4 of the semiconductor die $FD_4$ is coupled to the controller 40 via the chip enable pin CE4. As a result, each of the semiconductor die $FD_1$-$FD_4$ has its own chip enable signal sent from the controller 40 via its corresponding chip enable pin.

Regarding the settings of the mode select terminals TMS11-TMS13, TMS21-TMS23, TMS31-TMS33, and TMS41-TMS43, and the setting of the mode select signals of M_SEL1-M_SEL6, they are similar to the FIG. 5 and have been described previously in corresponding paragraphs, and will not be repeated here.

Figure 9A:
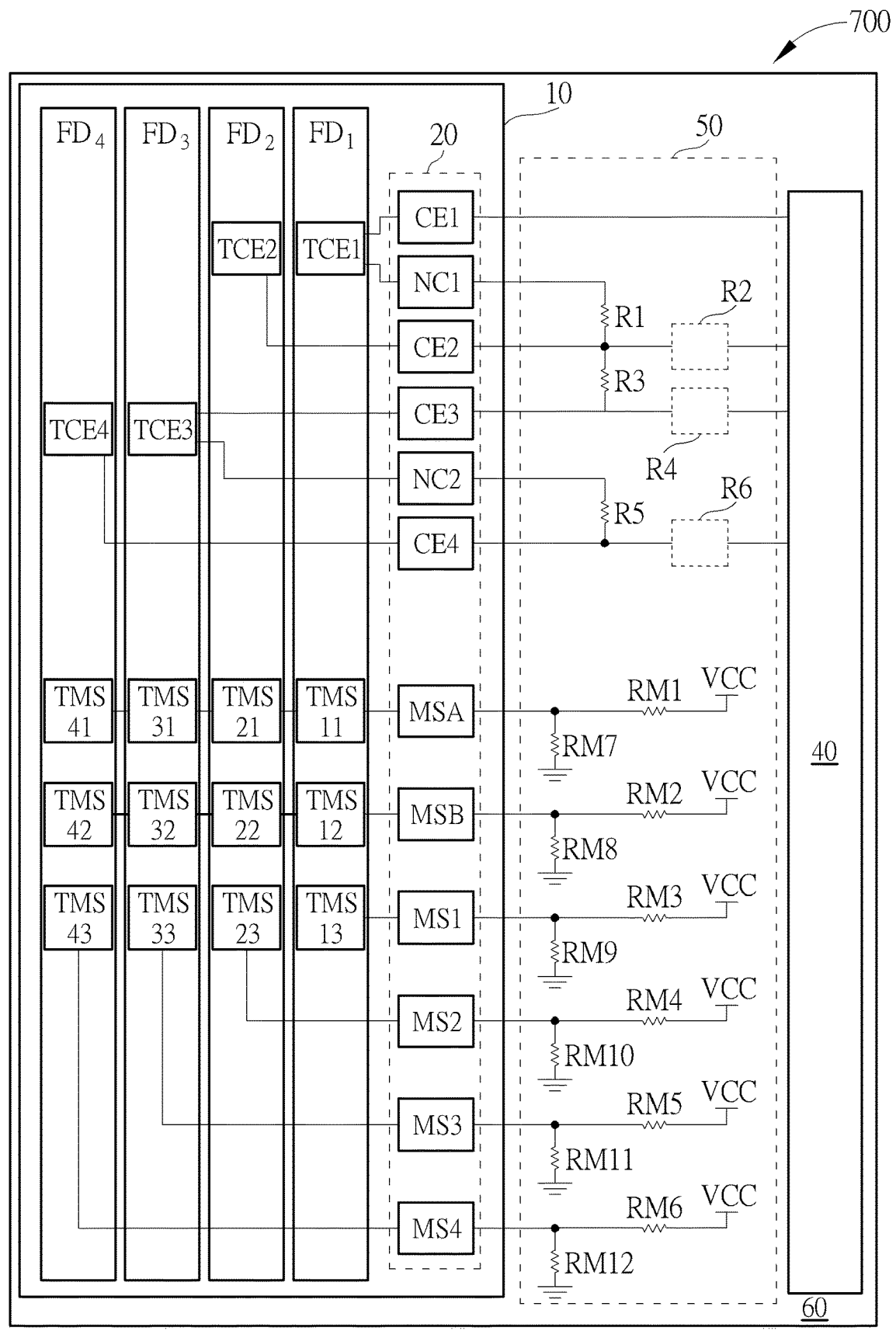
FIGS. 9A-9C are diagrams illustrating a semiconductor memory system according to another embodiment of the present invention.
Figure 9B:
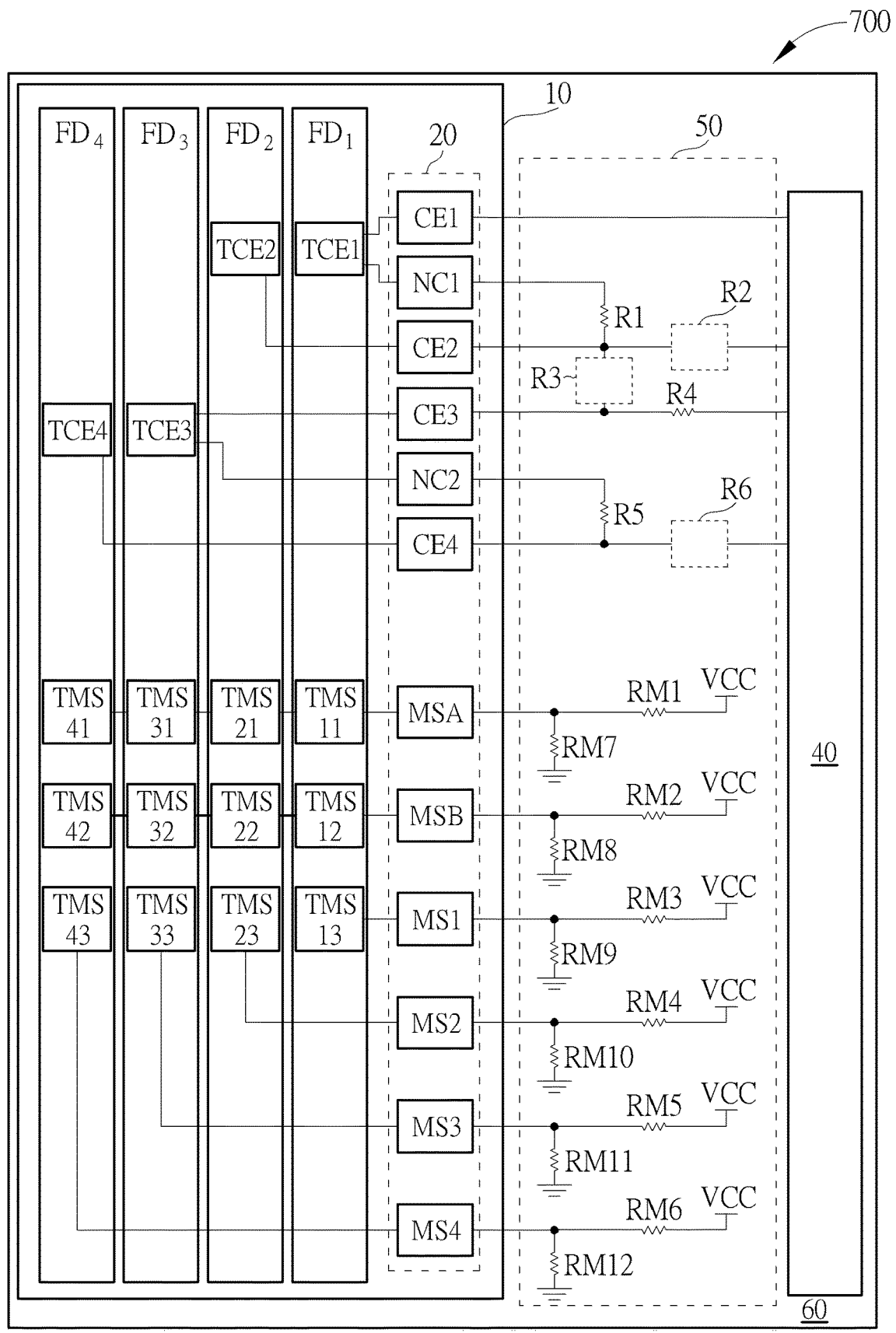
Figure 9C:
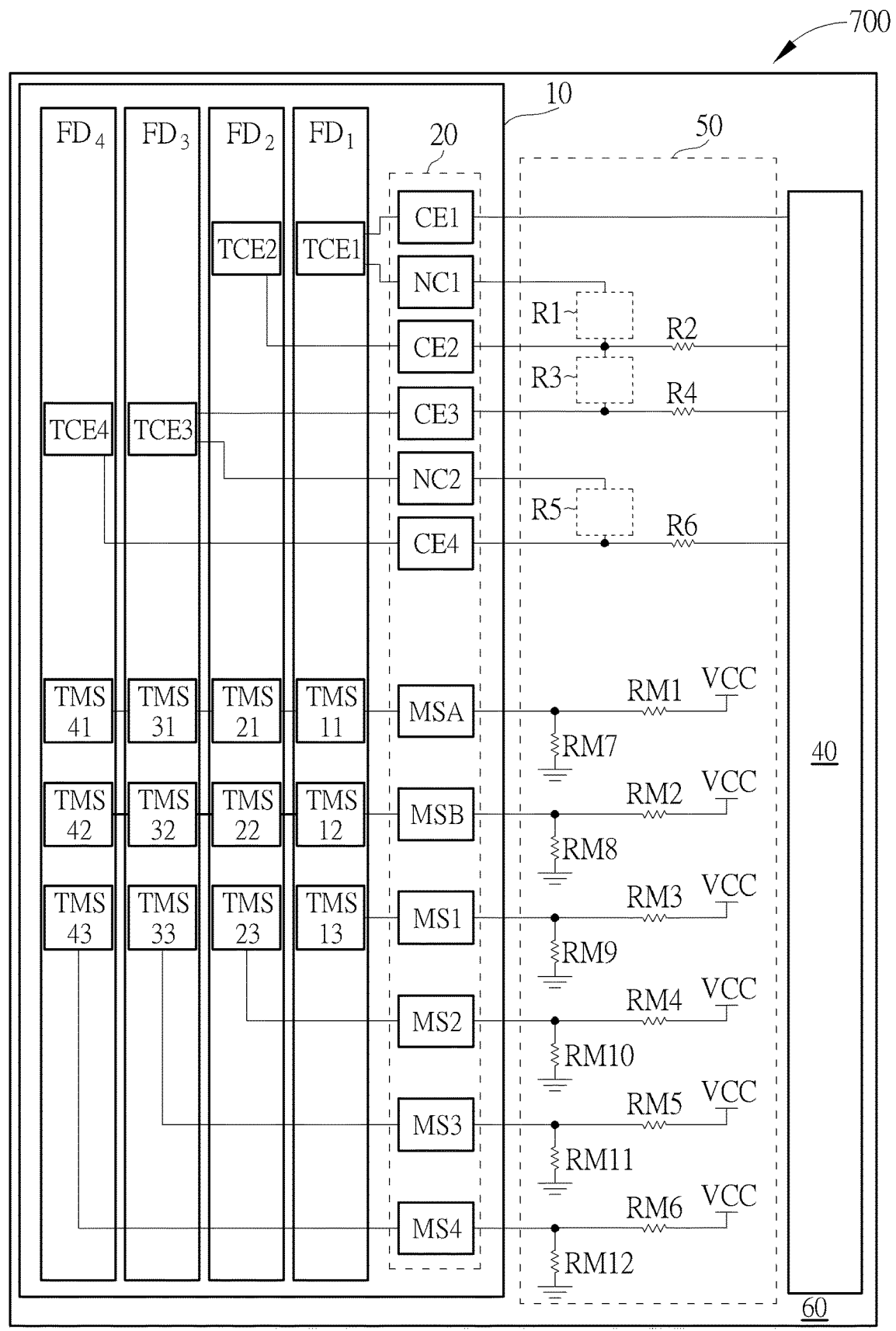

FIGS. 9A-9C are diagrams illustrating a semiconductor memory system 700 according to an embodiment of the present invention. The semiconductor memory system 700 includes the semiconductor memory package structure 10 depicted in FIG. 1, a controller 40 and a mode selecting circuit 50 provided on a PCB 60. For illustrative purpose, FIG. 9 depicts the embodiment of N=4 in which the semiconductor memory package structure 10 includes four semiconductor dice $FD_1$-$FD_4$ each having a chip enable terminal and three mode select terminals and a lead group 20 formed as an integral entity by using insulating material. However, the number of the semiconductor dice in the semiconductor memory package structure 10 does not limit the scope of the present invention.

In the semiconductor memory package structure 10 of the semiconductor memory system 700, the semiconductor die $FD_1$ includes a chip enable terminal TCE1 coupled to a chip enable pin CE1 and a no connection pin NC1 of the lead group 20, a mode select terminal TMS11 coupled to a mode select pin MSA of the lead group 20, a mode select terminal TMS12 coupled to a mode select pin MSB of the lead group 20, and a mode select terminal TMS13 coupled to a mode select pin MS1 of the lead group 20. The semiconductor die $FD_2$ includes a chip enable terminal TCE2 coupled to a chip enable pin CE2, a mode select terminal TMS21 coupled to the mode select pin MSA of the lead group 20, a mode select terminal TMS22 coupled to the mode select pin MSB of the lead group 20, and a mode select terminal TMS23 coupled to a mode select pin MS2 of the lead group 20. The semiconductor die $FD_3$ includes a chip enable terminal TCE3 coupled to a chip enable pin CE3 and a no connection pin NC2 of the lead group 20, a mode select terminal TMS31 coupled to the mode select pin MSA of the lead group 20, a mode select terminal TMS32 coupled to the mode select pin MSB of the lead group 20, and a mode select terminal TMS33 coupled to a mode select pin MS3 pin of the lead group 20. The semiconductor die $FD_4$ includes a chip enable terminal TCE4 coupled to a chip enable pin CE4 of the lead group 20, a mode select terminal TMS41 coupled to the mode select pin MSA of the lead group 20, a mode select terminal TMS42 coupled to the mode select pin MSB of the lead group 20, and a mode select terminal TMS43 coupled to a mode select pin MS4 of the lead group 20.

In the semiconductor memory package structure 10 of the semiconductor memory system 700, the mode selecting circuit 50 is configured to selectively couple a pin of the lead group 20 to the controller 40 or selectively couple two pins of the lead group 20, thereby adjusting the chip select configuration of the semiconductor memory package structure 10. The mode selecting circuit 50 may include resistors R1-R6 and RM1-RM12, wherein the resistor R1 may be selectively provided between the chip enable pin CE2 and the no connection pin NC1, the resistor R2 may be selectively provided between the chip enable pin CE2 and the controller 40, the resistor R3 may be selectively provided between the chip enable pins CE2 and CE3, the resistor R4 may be selectively provided between the chip enable pin CE3 and the controller 40, the resistor R5 may be selectively provided between the chip enable pin CE4 and the no connection pin NC2, the resistor R6 may be selectively provided between the chip enable pin CE4 and the controller 40, the resistor RM1 may be selectively provided between the mode select pin MSA and a bias voltage VCC, the resistor RM2 may be selectively provided between the mode select pin MSB and a bias voltage VCC, the resistor RM3 may be selectively provided between the mode select pin MS1 and a bias voltage VCC, the resistor RM4 may be selectively provided between the mode select pin MS2 and a bias voltage VCC, the resistor RM5 may be selectively provided between the mode select pin MS3 and a bias voltage VCC, the resistor RM6 may be selectively provided between the mode select pin MS4 and a bias voltage VCC, the resistor RM7 may be selectively provided between the mode select pin MSA and a ground, the resistor RM8 may be selectively provided between the mode select pin MSB and a ground, the resistor RM9 may be selectively provided between the mode select pin MS1 and a ground, the resistor RM10 may be selectively provided between the mode select pin MS2 and a ground, the resistor RM11 may be selectively provided between the mode select pin MS3 and a ground, and the resistor RM12 may be selectively provided between the mode select pin MS4 and a ground. In another embodiment, the resistors R1-R6 may be integrated into a variable resistor, and the resistors RM1-RM12 may be integrated into another variable resistor. The resistance of the variable resistors may be adjusted for functioning as open-circuited components or short-circuited components.

In the embodiment illustrated in FIG. 9A, the semiconductor memory package structure 700 may operate in a multiple LUNs per target configuration (four-die-one-CE) by providing the resistors R1, R3 and R5 in the mode selecting circuit 50 (or by switching the variable resistor to the position of the resistors R1, R3 and R5) and removing the resistors R2, R4 and R6 from the mode selecting circuit 50 (the resistors R2, R4 and R6 may be regarded as a plurality of paths which are cut off when the resistors R1-R6 are integrated into a variable resistor which is switched to the position of the resistors R1, R3 and R5). More specifically, the chip enable pin CE2 is electrically connected to the no connect pin NC1 via the resistor R1, the chip enable pin CE3 is electrically connected to the chip enable pin CE2 via the resistor R3, and the chip enable pin CE4 is electrically connected to the no connection pin NC2 via the resistor R5. Meanwhile, the direct paths from the chip enable pins CE2-CE4 to the controller 40 are cut off. Under such circumstance, the chip enable terminals TCE1-TCE4 of the semiconductor dice $FD_1$-$FD_4$ are coupled together. As a result, the semiconductor dice $FD_1$-$FD_4$ share one chip enable signal sent from the controller 40 via the chip enable pin CE1.

In the embodiment illustrated in FIG. 9B, the semiconductor memory package structure 700 may operate in a multiple LUNs per target configuration (four-die-two-CE) configuration by mounting the resistors R1, R4 and R5 in the mode selecting circuit 50 (or by switching the variable resistor to the position of the resistors R1, R4 and R5) and removing the resistors R2, R3 and R6 from the mode selecting circuit 50 (the resistors R2, R3 and R6 may be regarded as a plurality of paths which are cut off when the resistors R1-R6 are integrated into a variable resistor which is switched to the position of the resistors R1, R4 and R5). More specifically, the chip enable pin CE2 is electrically connected to the no connection pin NC1 via the resistor R1, the chip enable pin CE3 is electrically connected to the controller 40 via the resistor R4, and the chip enable pin CE4 is electrically connected to the no connection pin NC2 via the resistor R5. Meanwhile, the direct paths from the chip enable pin CE2 to the controller 40, from the chip enable pin CE3 to the chip enable pin CE2, and from the chip enable pin CE4 to the controller 40 are cut off. Under such circumstance, the chip enable terminals TCE1 of the semiconductor die $FD_1$ is coupled to the chip enable terminal TCE2 of the semiconductor die $FD_2$, and the chip enable terminal TCE3 of the semiconductor die $FD_3$ is coupled to the chip enable terminal TCE4 of the semiconductor die $FD_4$. As a result, the semiconductor dice $FD_1$ and $FD_2$ share one chip enable signal sent from the controller 40 via the chip enable pin CE1, and the semiconductor dice $FD_3$ and $FD_4$ share another chip enable signal sent from the controller 40 via the chip enable pin CE3.

In the embodiment illustrated in FIG. 9C, the semiconductor memory package structure 700 may operate in a one LUN per target configuration (four-die-four-CE) by providing the resistors R2, R4 and R6 in the mode selecting circuit 50 (or by switching the variable resistor to the position of R2, R4 and R6) and removing the resistors R1, R3 and R5 from the mode selecting circuit 50 (the resistors R1, R3 and R5 may be regarded as a plurality of paths which are cut off when the resistors R1-R6 are integrated into a variable resistor which is switched to the position of the resistors R2, R4 and R6). More specifically, the chip enable pin CE2 is electrically connected to the controller 40 via the resistor R2, the chip enable pin CE3 is electrically connected to the controller 40 via the resistor R4, and the chip enable pin CE4 is electrically connected to the controller 40 via the resistor R6. Meanwhile, the paths between the chip enable pin CE2 and the no connection pin NC1, between the chip enable pins CE2 and CE3, and between the chip enable pin CE4 and the no connection pin NC2 are cut off. Under such circumstance, the chip enable terminal TCE1 of the semiconductor die $FD_1$ is coupled to the controller 40 via the chip enable pin CE1, the chip enable terminal TCE2 of the semiconductor die $FD_2$ is coupled to the controller 40 via the chip enable pin CE2, the chip enable terminal TCE3 of the semiconductor die $FD_3$ is coupled to the controller 40 via the chip enable pin CE3, and the chip enable terminal TCE4 of the semiconductor die $FD_4$ is coupled to the controller 40 via the chip enable pin CE4. As a result, each of the semiconductor die $FD_1$-$FD_4$ has its own chip enable signal sent from the controller 40 via its corresponding chip enable pin.

In the semiconductor memory system 700, the mode select pins of each semiconductor die (i.e., the mode select terminals TMS11-TMS13 and TMS21-TMS23) need to be set for indicating a one LUN per target configuration or a multi LUNs per target configuration. In the embodiment illustrated in FIGS. 9A-9C, one or multiple among the resistors RM1-RM12 may be provided in the mode selecting circuit 50 for coupling the mode select terminals TMS11-TMS13 and TMS21-TMS23 to the bias voltage VCC or to the ground. The setting of the mode select terminals TMS11-TMS13 and TMS21-TMS23 has been described previously in FIG. 3A-3B, and will not be repeated here.

In the present invention, the semiconductor memory package structure 10 may be a flash memory package structure or a DRAM memory package structure. The present semiconductor memory system may be a flash-based memory system, a DRAM-based memory system or any volatile memory system, such as an SSD or a DRAM module. However, the type of the semiconductor memory package structure and the semiconductor memory system does not limit the scope of the present invention.

In conclusion, the most important technical structure of the present invention is that the chip enable terminal of at least one die in a semiconductor memory package structure is coupled to two pins of a lead group. This is different from the general semiconductor memory package structure that the chip enable terminal of each of all dice is coupled to only one pin of the lead group. Based on this structure, the chip enable configuration can be switched between a one LUN per target configuration and a multiple LUNs per target configuration by using a mode selecting circuit, and it is more convenient for manufacturer or product tester, even end user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory package structure, comprising:
   at least one semiconductor die including a chip enable terminal configured to receive an chip enable signal for enabling the at least one semiconductor die; and
   a lead group configured to electrically connect the at least one semiconductor die to an external circuit board, wherein a first pin and a second pin of the lead group are coupled to the chip enable terminal, and the at least one semiconductor die and the lead group are formed as an integral entity by using an insulating material.

2. The semiconductor memory package structure of claim 1, wherein the first pin and the second pin are coupled to the chip enable terminal by wire bonding.

3. A semiconductor memory system, comprising:
   a printed circuit board;
   a controller provided on the printed circuit board;
   a semiconductor memory package structure provided on the printed circuit board and comprising:
   a first semiconductor die including a first chip enable terminal;
   a second semiconductor die including a second chip enable terminal; and
   a lead group configured to electrically connect the first semiconductor die and the second semiconductor die to the printed circuit board and including:
   a first pin coupled to the first chip enable terminal;
   a second pin coupled to the first chip enable terminal and a third pin coupled to the second chip enable terminal;
wherein the first semiconductor die, the second semiconductor die and the lead group are formed as an integral entity by using an insulating material; and
a mode selecting circuit provided on the printed circuit board and electrically connected between the lead group and the controller for adjusting a chip enable configuration of the semiconductor memory package structure.

4. The semiconductor memory system of claim 3, wherein the mode selecting circuit further electrically connects the first pin to the controller, and adjusts the chip enable configuration of the semiconductor memory package structure by selectively coupling the third pin to the second pin or to the controller.

5. The semiconductor memory system of claim 4, wherein the mode selecting circuit further comprises:
a first resistor selectively coupled between the third pin and the second pin;
a second resistor selectively coupled between the third pin and the controller.

6. The semiconductor memory system of claim 4, wherein the mode selecting circuit further comprises:
a first switch having a first doping type and including:
a first end coupled to the second pin;
a second end coupled to the third pin; and
a control pin coupled to a first die select signal; and
a second switch having a second doping type different from the first doping type, and including:
a first end coupled to the third pin;
a second end coupled to the controller; and
a control pin coupled to the first die select signal.

7. The semiconductor memory system of claim 3, wherein:
the first semiconductor die further comprises a first mode select terminal, a second mode select terminal and a third mode select terminal;
the second semiconductor die further comprises a fourth mode select terminal, a fifth mode select terminal and a sixth mode select terminal;
the lead group further comprises:
a fourth pin coupled to the first mode select terminal and the fourth mode select terminal;
a fifth pin coupled to the second mode select terminal and the fifth mode select terminal;
a sixth pin coupled to the third mode select terminal; and
a seventh pin coupled to the sixth mode select terminal; and
the mode selecting circuit is further configured to indicate the chip enable configuration of the semiconductor memory package structure by selectively coupling the fourth pin, the fifth pin, the sixth pin and the seventh pin to a bias voltage.

8. The semiconductor memory system of claim 7, wherein the mode selecting circuit further electrically connects the first pin to the controller, and the mode selecting circuit further comprises:
a first resistor selectively coupled between the third pin and the second pin;
a second resistor selectively coupled between the third pin and the controller;
a third resistor selectively coupled between the fourth pin and the bias voltage;
a fourth resistor selectively coupled between the fifth pin and the bias voltage;
a fifth resistor selectively coupled between the sixth pin and the bias voltage;
a sixth resistor selectively coupled between the seventh pin and the bias voltage;
a seventh resistor selectively coupled between the fourth pin and a ground;
an eighth resistor selectively coupled between the fifth pin and the ground;
a ninth resistor selectively coupled between the sixth pin and the ground; and
a sixth resistor selectively coupled between the seventh pin and the ground.

9. The semiconductor memory system of claim 7, wherein the mode selecting circuit further electrically connects the first pin to the controller, and the mode selecting circuit further comprises:
a first switch having a first doping type and including:
a first end coupled to the fourth pin;
a second end coupled to the bias voltage; and
a control pin coupled to a first mode select signal; and
a second switch having a second doping type and including:
a first end coupled to the fifth pin;
a second end coupled to the bias voltage; and
a control pin coupled to a second mode select signal; and
a third switch having a third doping type and including:
a first end coupled to the sixth pin;
a second end coupled to the bias voltage; and
a control pin coupled to a third mode select signal; and
a fourth switch having a fourth doping type and including:
a first end coupled to the seventh pin;
a second end coupled to the bias voltage; and
a control pin coupled to a fourth mode select signal.

10. The semiconductor memory system of claim 3, wherein:
the semiconductor memory package structure further comprises:
a third semiconductor die including a third chip enable terminal;
a fourth semiconductor die including a fourth chip enable terminal; and
the lead group further includes:
a fourth pin coupled to the second chip enable terminal;
a fifth pin coupled to the third chip enable terminal;
a sixth pin coupled to the third chip enable terminal; and
a seventh pin coupled to the fourth chip enable terminal;
wherein the first semiconductor die, the second semiconductor die, the third semiconductor die, the fourth semiconductor die and the lead group are formed as the integral entity by using the insulating material.

11. The semiconductor memory system of claim 10, wherein the mode selecting circuit further electrically connects the first pin to the controller, and adjusts the chip enable configuration of the semiconductor memory package structure by selectively coupling the third pin to the second pin or to the controller, selectively coupling the fifth pin to the fourth pin or to the controller, and selectively coupling the seventh pin to the sixth pin or to the controller.

12. The semiconductor memory system of claim 11, wherein the mode selecting circuit further comprises:
a first resistor selectively coupled between the second pin and the third pin;
a second resistor selectively coupled between the third pin and the controller;

a third resistor selectively coupled between the fourth pin and the fifth pin;
a fourth resistor selectively coupled between the fifth pin and the controller;
a fifth resistor selectively coupled between the sixth pin and the seventh pin; and
a sixth resistor selectively coupled between the seventh pin and the controller.

13. The semiconductor memory system of claim 3, wherein:
   the semiconductor memory package structure further comprises:
      a third semiconductor die including a third chip enable terminal;
      a fourth semiconductor die including a fourth chip enable terminal;
   the lead group further includes:
      a fourth pin coupled to the third chip enable terminal;
      a fifth pin coupled to the third chip enable terminal; and
      a sixth pin coupled to the fourth chip enable terminal 1;
      wherein the first semiconductor die, the second semiconductor die, the third semiconductor die, the fourth semiconductor die and the lead group are formed as the integral entity by using the insulating material.

14. The semiconductor memory system of claim 13, wherein the mode selecting circuit further electrically connects the first pin to the controller, and adjusts the chip enable configuration of the semiconductor memory package structure by selectively coupling the third pin to the second pin or to the controller, selectively coupling the fourth pin to the third pin or to the controller, and selectively coupling the sixth pin to the fifth pin or to the controller.

15. The semiconductor memory system of claim 14, wherein the mode selecting circuit further comprises:
   a first switch having a first doping type and including:
      a first end coupled to the second pin;
      a second end coupled to the third pin; and
      a control pin coupled to a first die select signal;
   a second switch having the first doping type and including:
      a first end coupled to the third pin;
      a second end coupled to the fourth pin; and
      a control pin coupled to a second die select signal;
   a third switch having the first doping type and including:
      a first end coupled to the fifth pin;
      a second end coupled to the sixth pin; and
      a control pin coupled to the first die select signal;
   a fourth switch having a second doping type different from the first doping type, and including:
      a first end coupled to the third pin;
      a second end coupled to the controller; and
      a control pin coupled to the first die select signal;
   a fifth switch having the second doping type and including:
      a first end coupled to the fourth pin;
      a second end coupled to the controller; and
      a control pin coupled to the second die select signal;
   a sixth switch having the second doping type and including:
      a first end coupled to the sixth pin;
      a second end coupled to the controller; and
      a control pin coupled to the first die select signal.

16. A semiconductor memory system, comprising:
   a printed circuit board;
   a controller provided on the printed circuit board;
   a semiconductor memory package structure, comprising:
      a first semiconductor die comprising a first chip enable terminal;
      a second semiconductor die comprising a second chip enable terminal; and
      a lead group configured to electrically connect the first semiconductor die and the second semiconductor die to the printed circuit board and comprising:
         a first pin coupled to the first chip enable terminal;
         a second pin coupled to the first chip enable terminal;
         a third pin coupled to the second chip enable terminal; and
         a fourth pin coupled to the second chip enable terminal;
      wherein the first semiconductor die, the second semiconductor die and the lead group are provided on the printed circuit board as an integral entity using an insulating material; and
   a mode selecting circuit provided on the printed circuit board and configured to adjust a chip enable configuration of the semiconductor memory package structure.

17. The semiconductor memory system of claim 16, wherein the mode selecting circuit further electrically connects the first pin to the controller, and adjusts the chip enable configuration of the semiconductor memory package structure by selectively coupling the third pin to the controller or coupling the second pin to the fourth pin.

18. The semiconductor memory system of claim 17, wherein the mode selecting circuit further comprises:
   a first resistor selectively provided between the second pin and the fourth pin; and
   a second resistor selectively provided between the third pin and the controller.

19. The semiconductor memory system of claim 17, wherein:
   the first semiconductor die further includes a first mode select terminal, a second mode select terminal and a third mode select terminal;
   the second semiconductor die further comprises a fourth mode select terminal, a fifth mode select terminal and a sixth mode select terminal;
   the lead group further comprises:
      a fifth pin coupled to the first mode select terminal and the fourth mode select terminal;
      a sixth mode select pin coupled to the second mode select terminal and the fifth mode select terminal;
      a seventh pin coupled to the third mode select terminal; and
      an eighth pin coupled to the sixth mode select terminal;
   the mode selecting circuit is further configured to indicate the chip enable configuration of the semiconductor memory package structure by selectively coupling the fifth pin, the sixth pin, the seventh pin and the eighth pin to a bias voltage.

20. The semiconductor memory system of claim 19, wherein the mode selecting circuit further comprises:
   a first resistor selectively provided between the fifth pin and the bias voltage;
   a second resistor selectively provided between the sixth pin and the bias voltage;
   a third resistor selectively provided between the seventh pin and the bias voltage;
   a fourth resistor selectively provided between the eighth pin and the bias voltage;
   a fifth resistor selectively provided between the fifth pin and a ground;

a sixth resistor selectively provided between the sixth pin and the ground;
a seventh resistor selectively provided between the seventh pin and the ground; and
an eighth resistor selectively provided between the eighth pin and the ground.

\* \* \* \* \*